(12) United States Patent
Du et al.

(10) Patent No.: US 12,356,650 B2
(45) Date of Patent: Jul. 8, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Ziming Du, Suzhou (CN); Changan Li, Suzhou (CN); Weixing Du, Suzhou (CN); Jheng-Sheng You, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 409 days.

(21) Appl. No.: 17/691,057

(22) Filed: Mar. 9, 2022

(65) Prior Publication Data
US 2023/0215912 A1 Jul. 6, 2023

Related U.S. Application Data

(63) Continuation of application No. 17/639,910, filed as application No. PCT/CN2021/143738 on Dec. 31, 2021.

(51) Int. Cl.
*H10D 30/47* (2025.01)
*H01L 21/265* (2006.01)
(Continued)

(52) U.S. Cl.
CPC ..... *H10D 30/475* (2025.01); *H01L 21/26546* (2013.01); *H01L 21/266* (2013.01);
(Continued)

(58) Field of Classification Search
CPC ........... H01L 29/7786; H01L 21/26546; H01L 21/266; H01L 21/7605; H01L 21/761;
(Continued)

(56) References Cited

U.S. PATENT DOCUMENTS 6,566,201 B1 * 5/2003 Blanchard ......... H01L 29/66712
257/E29.066
7,863,648 B2 1/2011 Miyamoto et al.
(Continued)

FOREIGN PATENT DOCUMENTS

CN 1950945 A 4/2007
CN 101320750 A 12/2008
(Continued)

OTHER PUBLICATIONS

International Search Report and Written Opinion of the corresponding PCT application No. PCT/CN2021/143738 mailed on May 7, 2022.
(Continued)

*Primary Examiner* — Mohammed Shamsuzzaman
(74) *Attorney, Agent, or Firm* — Li & Cai Intellectual Property (USA) Office

(57) ABSTRACT

A semiconductor device includes a first nitride-based semiconductor layer, a second nitride-based semiconductor layer, a gate electrode, a source electrode, a drain electrode, and a group of negatively-charged ions. The gate electrode is located between the source and drain electrodes to define a drift region between the gate and drain electrodes. A group of negatively-charged ions are implanted into the drift region and over the 2DEG region and spaced apart from the gate and drain electrodes and spaced apart from an area directly beneath the gate and drain electrodes. The gate electrode is closer to the negatively-charged ions than the drain electrode, such that the negatively-charged ions deplete at least one portion of the 2DEG region which is near the gate electrode.

8 Claims, 30 Drawing Sheets

(51) Int. Cl.
    *H01L 21/266*      (2006.01)
    *H01L 21/76*      (2006.01)
    *H01L 21/761*      (2006.01)
    *H10D 30/01*      (2025.01)
    *H10D 62/10*      (2025.01)
    *H10D 62/824*      (2025.01)
    *H10D 62/85*      (2025.01)
    *H10D 64/00*      (2025.01)

(52) U.S. Cl.
    CPC ........ H01L 21/7605 (2013.01); H01L 21/761 (2013.01); H10D 30/015 (2025.01); H10D 62/111 (2025.01); H10D 62/824 (2025.01); H10D 62/8503 (2025.01); H10D 64/111 (2025.01)

(58) Field of Classification Search
    CPC ............. H01L 29/0634; H01L 29/2003; H01L 29/205; H01L 29/402; H01L 29/66431; H01L 29/66462; H01L 29/0642; H01L 29/0692; H01L 29/0657; H01L 29/207; H01L 29/36; H10D 30/475; H10D 30/015; H10D 62/111; H10D 62/824; H10D 62/8503; H10D 64/111; H10D 62/113; H10D 62/117; H10D 62/126; H10D 62/60; H10D 62/854

See application file for complete search history.

(56) References Cited

U.S. PATENT DOCUMENTS

| | | | |
|---|---|---|---|
| 7,964,915 B2 | 6/2011 | Tanaka et al. | |
| 8,124,505 B1 | 2/2012 | Burnham | |
| 8,519,438 B2 * | 8/2013 | Mishra | H01L 21/0217 257/192 |
| 8,564,020 B2 * | 10/2013 | Chen | H01L 29/66212 257/E21.403 |
| 8,581,261 B2 | 11/2013 | Kanamura et al. | |
| 8,686,458 B2 | 4/2014 | Krames et al. | |
| 8,728,884 B1 | 5/2014 | Hussain et al. | |
| 9,054,168 B2 | 6/2015 | Kinoshita et al. | |
| 9,059,327 B2 | 6/2015 | Morizuka | |
| 9,276,077 B2 | 3/2016 | Basu | |
| 9,711,633 B2 | 7/2017 | Sheppard | |
| 10,229,912 B2 | 3/2019 | Sato et al. | |
| 11,387,328 B2 | 7/2022 | Ramaswamy et al. | |
| 2007/0026587 A1 * | 2/2007 | Briere | H01L 29/513 257/E29.253 |
| 2007/0114569 A1 | 5/2007 | Wu et al. | |
| 2007/0158683 A1 | 7/2007 | Sheppard | |
| 2007/0295993 A1 | 12/2007 | Chen et al. | |
| 2009/0072272 A1 | 3/2009 | Suh et al. | |
| 2009/0078964 A1 * | 3/2009 | Briere | H01L 21/8252 257/E29.091 |
| 2009/0090984 A1 | 4/2009 | Khan et al. | |
| 2009/0146185 A1 | 6/2009 | Suh et al. | |
| 2010/0084687 A1 * | 4/2010 | Chen | H01L 29/7788 257/E21.403 |
| 2010/0117146 A1 * | 5/2010 | Ikeda | H01L 29/4236 438/270 |
| 2013/0256688 A1 * | 10/2013 | Morizuka | H01L 21/28581 438/571 |
| 2013/0256753 A1 * | 10/2013 | Morizuka | H01L 29/66431 257/192 |
| 2016/0141405 A1 | 5/2016 | Werner et al. | |
| 2017/0047437 A1 | 2/2017 | Nakayama et al. | |
| 2018/0097070 A1 | 4/2018 | Miura et al. | |
| 2018/0151681 A1 * | 5/2018 | Lavanga | H01L 29/205 |
| 2018/0308968 A1 | 10/2018 | Miura et al. | |
| 2018/0350944 A1 | 12/2018 | Huang | |
| 2020/0303533 A1 | 9/2020 | Guo et al. | |
| 2020/0373421 A1 | 11/2020 | Nidhi et al. | |
| 2020/0395475 A1 | 12/2020 | Bothe et al. | |
| 2022/0189947 A1 | 6/2022 | Huang et al. | |
| 2022/0376099 A1 | 11/2022 | Bothe et al. | |
| 2023/0009662 A1 | 1/2023 | Hata | |
| 2023/0131602 A1 | 4/2023 | Arnold et al. | |
| 2023/0215939 A1 * | 7/2023 | Du | H01L 29/0657 257/183 |
| 2023/0253486 A1 | 8/2023 | Lavanga et al. | |
| 2024/0030330 A1 | 1/2024 | He et al. | |
| 2024/0038887 A1 * | 2/2024 | Du | H01L 29/402 |
| 2024/0105824 A1 | 3/2024 | Bothe et al. | |

FOREIGN PATENT DOCUMENTS

| | | | | |
|---|---|---|---|---|
| CN | 101336482 A | * | 12/2008 | ......... H01L 21/8252 |
| CN | 102683394 A | * | 9/2012 | ......... H01L 29/1066 |
| CN | 203013723 U | | 6/2013 | |
| CN | 103227205 A | * | 7/2013 | ......... H01L 29/1066 |
| CN | 104393040 A | | 3/2015 | |
| CN | 104821340 A | | 8/2015 | |
| CN | 106158948 A | * | 11/2016 | ....... H01L 21/26546 |
| CN | 104584219 B | | 10/2017 | |
| CN | 109065453 A | * | 12/2018 | ......... H01L 29/1066 |
| CN | 111668304 A | | 9/2020 | |
| CN | 112331719 A | | 2/2021 | |
| CN | 113287200 A | | 8/2021 | |
| CN | 113439340 A | | 9/2021 | |
| CN | 114846620 A | | 8/2022 | |
| JP | 2010251456 A | * | 11/2010 | ......... H01L 21/8252 |
| WO | WO 2017015225 A1 | | 1/2017 | |
| WO | WO 2022126353 A1 | | 6/2022 | |
| WO | WO 2023009405 A1 | | 2/2023 | |

OTHER PUBLICATIONS

USPTO, Office Action issued on Nov. 7, 2024 for U.S. Appl. No. 17/691,061.

USPTO, Office Action issued on Dec. 24, 2024 for U.S. Appl. No. 17/639,910.

USPTO, Final Office Action Issued in U.S. Appl. No. 17/691,061 on Mar. 18, 2025.

\* cited by examiner

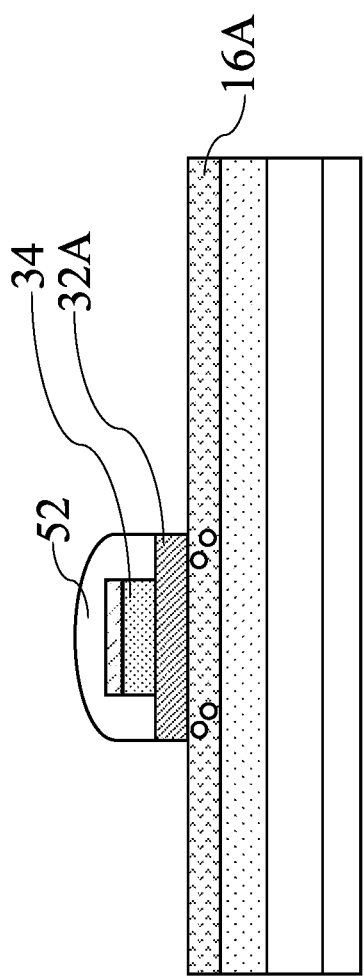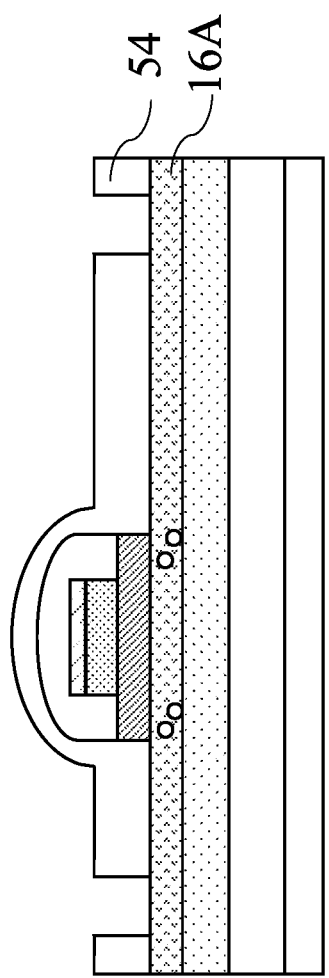

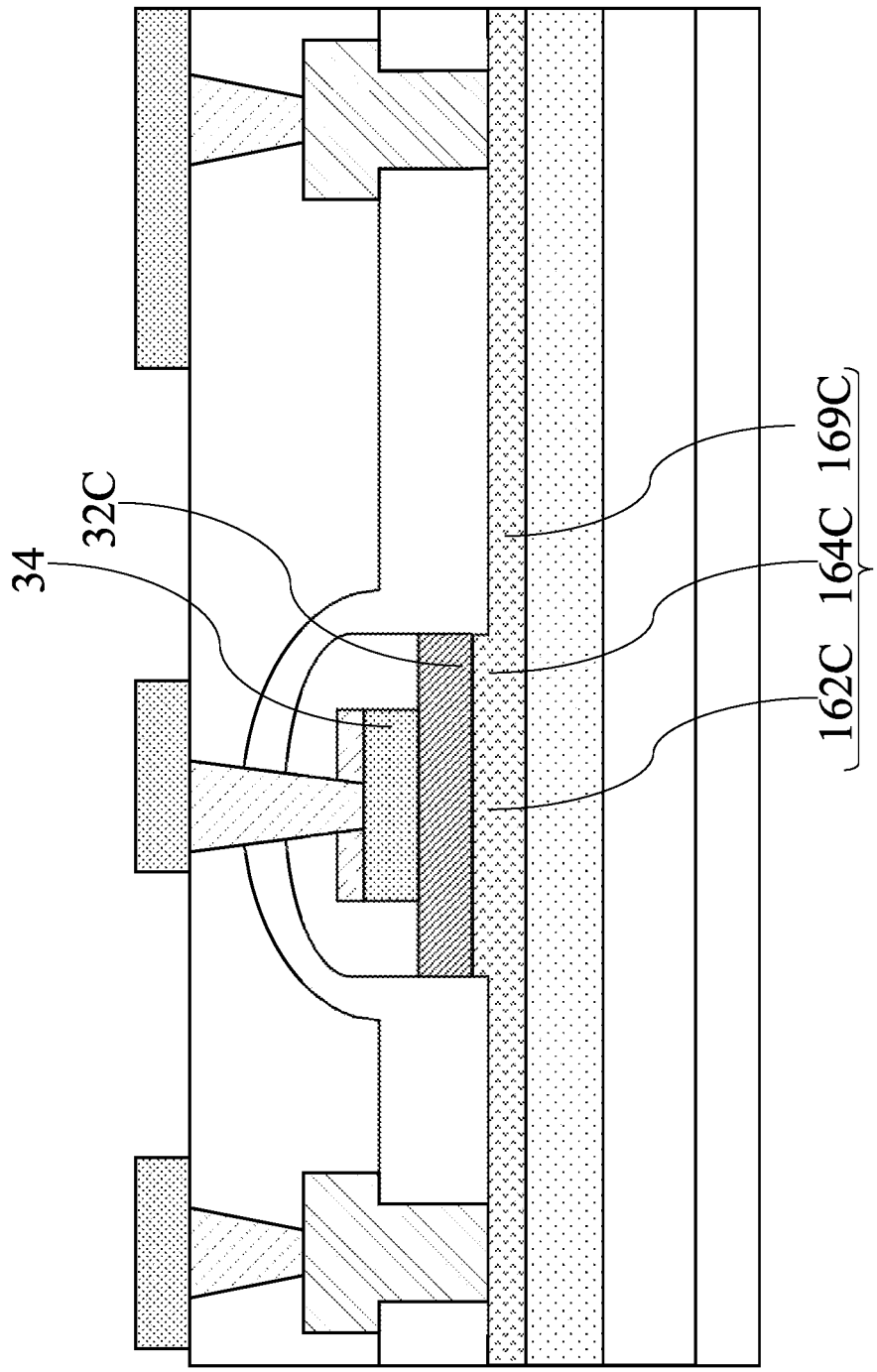

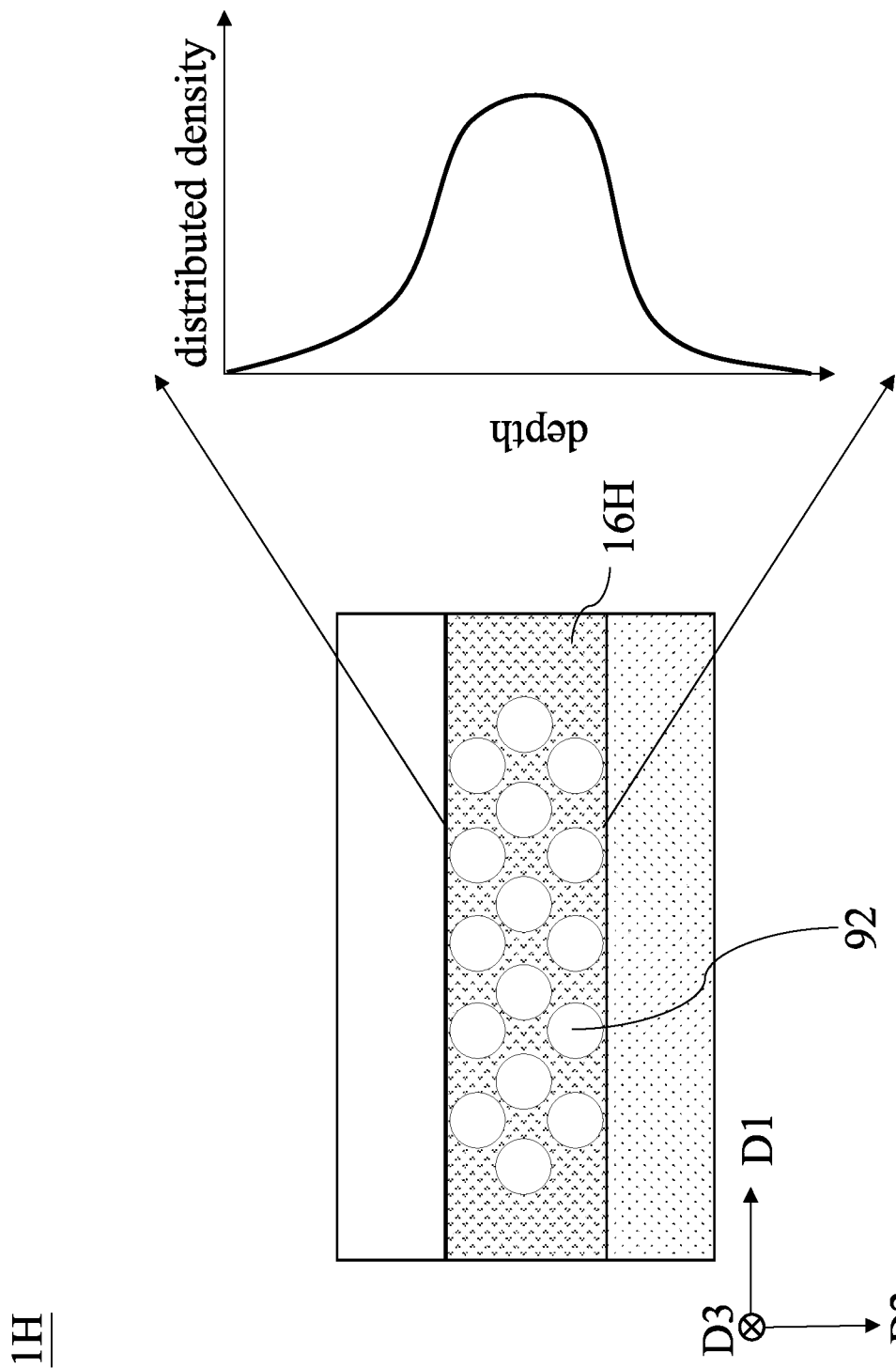

SEMICONDUCTOR DEVICE AND METHOD FOR MANUFACTURING THE SAME

CROSS-REFERENCES TO RELATED APPLICATIONS

This application is a continuation application of U.S. application Ser. No. 17/639,910, filed on Mar. 3, 2022, which is a national phase application of PCT/CN2021/143738 filed on Dec. 31, 2021, the disclosure of which are incorporated herein by reference in their entirety.

FIELD OF THE DISCLOSURE

The present disclosure generally relates to a nitride-based semiconductor device. More specifically, the present disclosure relates to a semiconductor device having negatively-charged ions.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a semiconductor device is provided. The semiconductor device includes a first nitride-based semiconductor layer, a second nitride-based semiconductor layer, a gate electrode, and a doped nitride-based semiconductor layer. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The doped nitride-based semiconductor layer is disposed between the second nitride-based semiconductor layer and the gate electrode. The doped nitride-based semiconductor layer has a pair of opposite ledge portions free from coverage of the gate electrode and a central portion therebetween. The second nitride-based semiconductor layer has a first portion beneath the central portion and a second portion beneath the ledge portion, and the second nitride-based semiconductor layer has a doping concentration of a dopant that selected from a highly electronegative group. The doping concentration from the first portion to the second portion increases.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A blanket doped nitride-based semiconductor layer is formed on the second nitride-based semiconductor layer. A blanket gate electrode layer is formed over the blanket doped nitride-based semiconductor layer. A first dielectric layer is formed over the blanket gate electrode layer. The blanket gate electrode layer and the first dielectric layer are patterned to form a gate electrode covered by the patterned first dielectric layer, so as to expose the blanket doped nitride-based semiconductor layer. An ion implantation process is performed, such that at least one portion of the second nitride-based semiconductor layer beneath the exposed blanket doped nitride-based semiconductor layer is doped with a dopant selected from a highly electronegative group. The exposed blanket doped nitride-based semiconductor layer is removed.

In accordance with one aspect of the present disclosure, a semiconductor device is provided. The semiconductor device includes a first nitride-based semiconductor layer, a second nitride-based semiconductor layer, a gate electrode, and a doped nitride-based semiconductor layer. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The doped nitride-based semiconductor layer is disposed between the second nitride-based semiconductor layer and the gate electrode. The doped nitride-based semiconductor layer has a pair of opposite side surfaces which are spaced apart from each other by a distance greater than a width of the gate electrode. The second nitride-based semiconductor layer has a doping concentration of a dopant that selected from a highly electronegative group, and the doping concentration decreases and then increases between the side surfaces of the second doped nitride-based semiconductor layer.

In accordance with one aspect of the present disclosure, a semiconductor device is provided. The semiconductor device includes a first nitride-based semiconductor layer, second nitride-based semiconductor layer, a gate electrode, a source electrode, a drain electrode, and a group of negatively-charged ions. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The gate electrode is disposed above the second nitride-based semiconductor layer. The source electrode and the drain electrode are disposed above the second nitride-based semiconductor layer. The gate electrode is located between the source and drain electrodes to define a drift region between the gate and drain electrodes. A group of negatively-charged ions are implanted into the drift region and over the 2DEG region and spaced apart from the gate and drain electrodes and spaced apart from an area directly beneath the gate and drain electrodes. The gate electrode is closer to the negatively-charged ions than the drain electrode, such that the negatively-charged ions deplete at least one portion of the 2DEG region which is near the gate electrode.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A blanket doped nitride-based semiconductor layer is formed on the second nitride-based semiconductor layer. A mask is formed with at least one opening on the blanket doped nitride-based semiconductor layer to expose at least one portion of blanket doped nitride-based semiconductor layer. An ion implantation process is performed using negatively-charged ions to distribute the negatively-charged ions in the exposed portion of the blanket doped nitride-based semiconductor layer and a portion of the second nitride-based semiconductor layer beneath the exposed portion of the blanket doped nitride-based semiconductor layer. The mask is removed from the blanket doped nitride-based semiconductor layer. The blanket doped nitride-based semiconductor layer such that the exposed portion of the blanket doped nitride-based semiconductor layer is removed, so as to form a doped nitride-based semiconductor layer. The blanket doped nitride-based semiconductor layer is patterned such that the exposed portion of the blanket doped nitride-based semiconductor layer is removed, so as to form a doped nitride-based semiconductor layer. The mask is removed from the blanket doped nitride-based semiconductor layer. The blanket doped nitride-based semiconductor layer is patterned such that the exposed portion of the blanket doped nitride-based semiconductor layer is removed, so as to form a doped nitride-based semiconductor layer.

In accordance with one aspect of the present disclosure, a semiconductor device is provided. The semiconductor device includes a first nitride-based semiconductor layer, a second nitride-based semiconductor layer, at least one high resistivity zone, a gate electrode, and a doped nitride-based semiconductor layer. The second nitride-based semiconductor layer is disposed on the first nitride-based semiconductor layer and has a bandgap greater than a bandgap of the first nitride-based semiconductor layer. At least one high resistivity zone is formed by a group of negatively-charged ions and embedded in the second nitride-based semiconductor layer. The source electrode and the drain electrode are disposed above the second nitride-based semiconductor layer and spaced apart from the high resistivity zone. The gate electrode is disposed above the second nitride-based semiconductor layer and between the source and drain electrodes. The gate electrode is vertically and horizontally separated from the high resistivity zone. The doped nitride-based semiconductor layer is disposed between the second nitride-based semiconductor layer and the gate electrode and vertically separated from the high resistivity zone.

In accordance with one aspect of the present disclosure, a semiconductor device is provided. The semiconductor device includes a first nitride-based semiconductor layer, a second nitride-based semiconductor layer, a group of negatively-charged ions, and a field plate. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The gate electrode and the drain electrode disposed above the second nitride-based semiconductor layer to define a drift region therebetween. The group of negatively-charged ions are implanted into the drift region and spaced apart from an area directly beneath the gate and drain electrodes to form at least one high resistivity zone in the second nitride-based semiconductor layer. The field plate is disposed over the gate electrode and extends in a region between the gate electrode and the high resistivity zone.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A gate electrode is formed over the second nitride-based semiconductor layer. A first dielectric layer is formed to cover the gate electrode. A mask is formed with an opening over the second nitride-based semiconductor layer and the first dielectric layer, such that at least one portion of the second nitride-based semiconductor layer is exposed from the opening. An ion implantation process is performed such that the exposed portion of the second nitride-based semiconductor layer is doped with a dopant selected from a highly electronegative group, so as to form a high resistivity zone in the second nitride-based semiconductor layer. A field plate is formed over the gate electrode and extends in a region between the gate electrode and the high resistivity zone.

In accordance with one aspect of the present disclosure, a semiconductor device is provided. The semiconductor device includes a first nitride-based semiconductor layer, a second nitride-based semiconductor layer, at least one high resistivity zone, a drain electrode, a gate electrode, and a field plate. The second nitride-based semiconductor layer is disposed on the first nitride-based semiconductor layer and has a bandgap greater than a bandgap of the first nitride-based semiconductor layer. At least one high resistivity zone is formed by a group of negatively-charged ions and doped in the second nitride-based semiconductor layer. The drain electrode is disposed above the second nitride-based semiconductor layer and spaced apart from the high resistivity zone. The gate electrode is disposed above the second nitride-based semiconductor layer and vertically and horizontally separated from the high resistivity zone. The field plate is disposed over the gate electrode. A vertical projection of the field plate on the second nitride-based semiconductor layer at least partially overlaps with the high resistivity zone.

By the above configuration, with implanting the dopants at least into the second nitride-based semiconductor layer (e.g., barrier layer), the electric field distribution of the semiconductor device can be modified. As such, the semiconductor device can be made without using any field plates or with only a single field plate.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2A, FIG. 2B, FIG. 2C, FIG. 2D, FIG. 2E, FIG. 2F, FIG. 2G and FIG. 2H show different stages of a method for manufacturing a semiconductor device according to some embodiments of the present disclosure;

FIG. 4 is a vertical cross-sectional view of a semiconductor device according to some embodiments of the present disclosure;

FIG. 10C is a distribution of the negatively-charged ions in a region of the semiconductor device in the FIG. 10B;

DETAILED DESCRIPTION

Figure 1A:
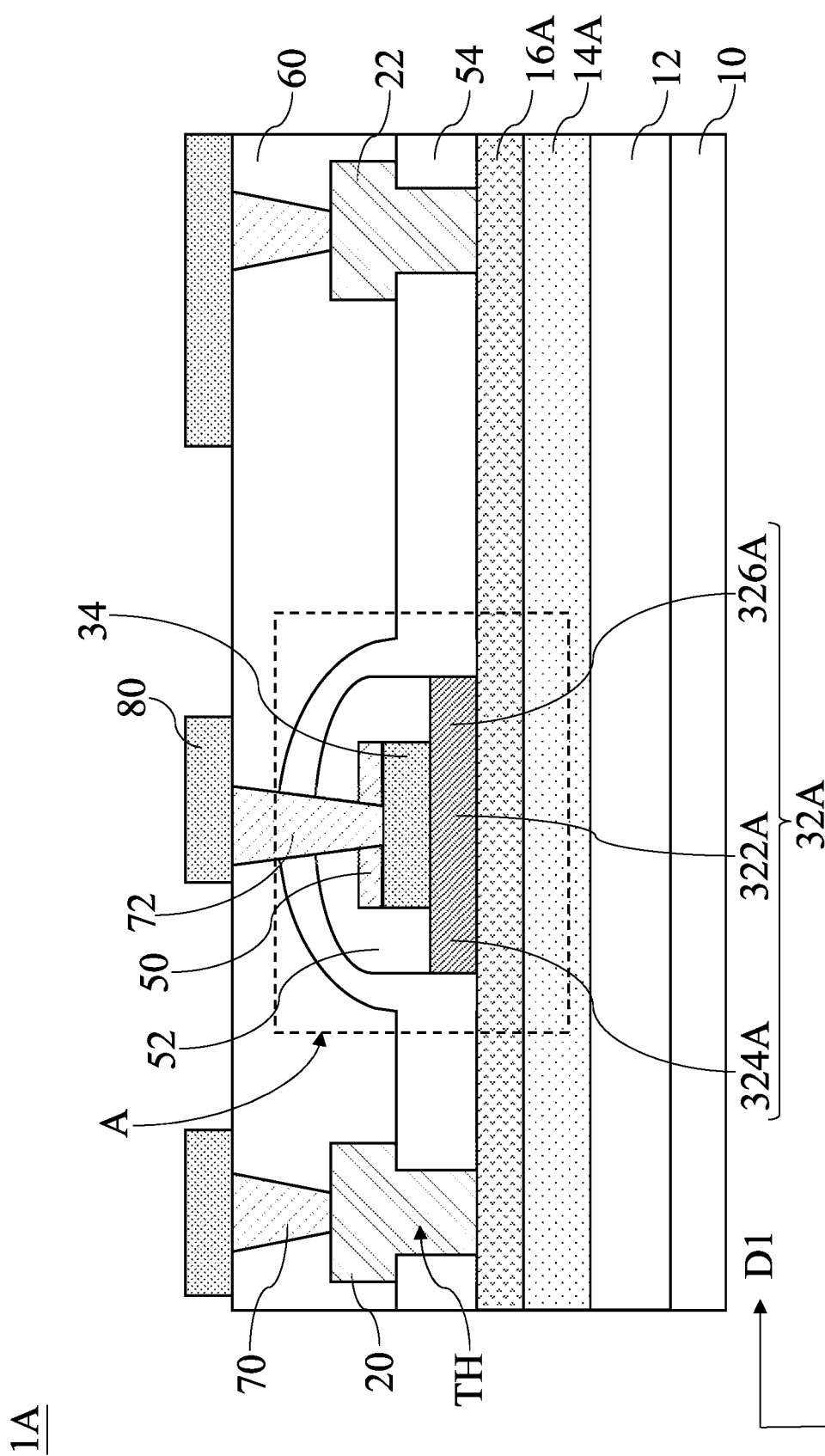
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
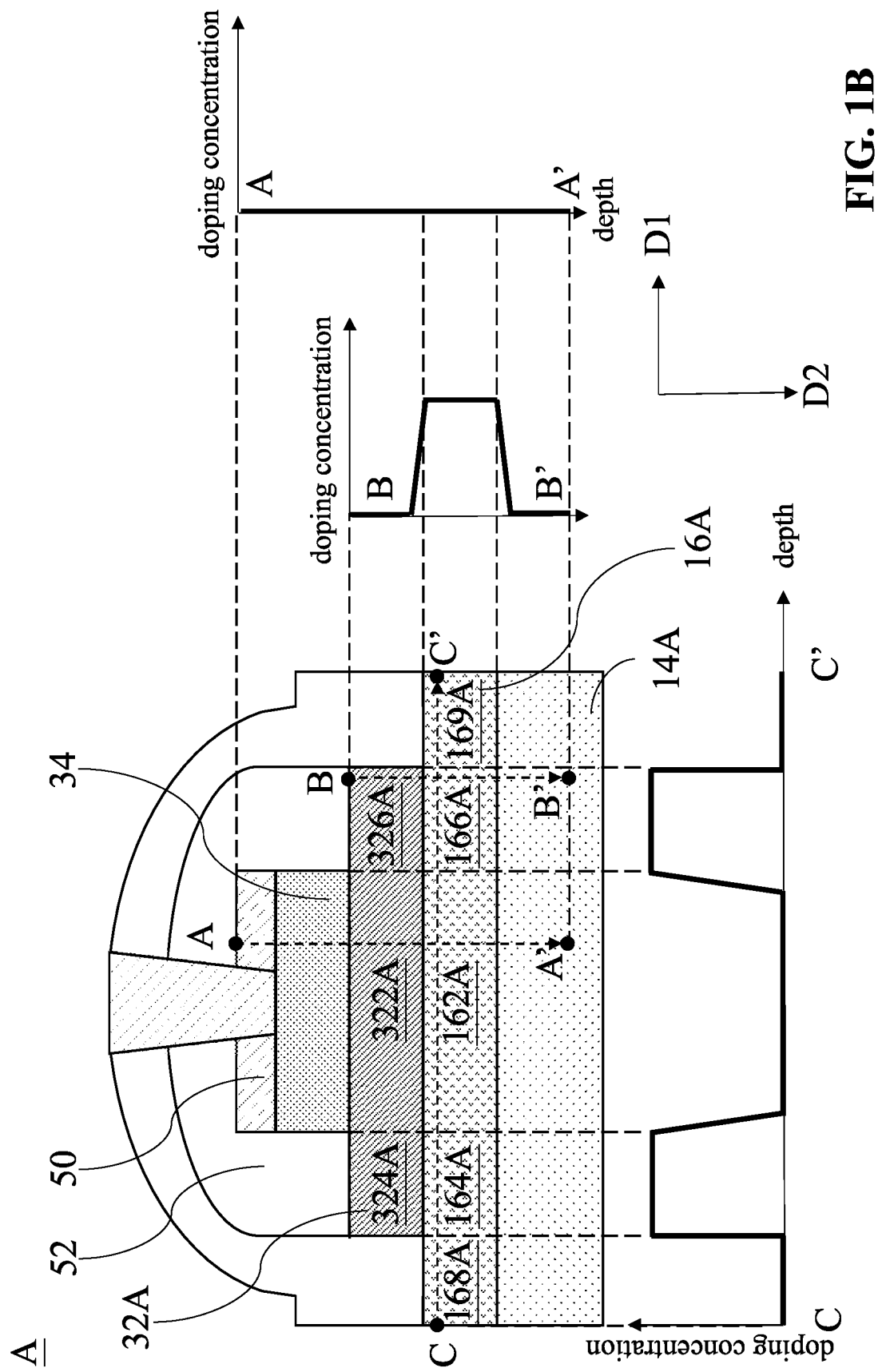
FIG. 1B is an enlarged vertical cross-sectional view of a region in FIG. 1A.

FIG. 1A is a vertical cross-sectional view of a semiconductor device 1A according to some embodiments of the present disclosure. FIG. 1B is an enlarged vertical cross-sectional view of a region A in FIG. 1A. The directions D1 and D2 are labeled in the FIGS. 1A and 1B, in which the direction D1 is different than the direction D2. In some embodiments, the directions D1 and D2 are perpendicular to each other. For example, the direction D1 is the horizontal direction of FIGS. 1A and 1B and the direction D2 is the vertical direction of FIGS. 1A and 1B.

The semiconductor device 1A includes a substrate 10, a buffer layer 12, nitride-based semiconductor layers 14A and 16A, electrodes 20 and 22, a doped nitride-based semiconductor layer 32A, a gate electrode 34, dielectric layers 50, 52, and 54, a passivation layer 60, contact vias 70 and 72, a patterned circuit layer 80.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14A. The buffer layer 12 can be configured to reduce lattice and thermal mismatches between the substrate 10 and the nitride-based semiconductor layer 14A, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof. In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14A can be disposed on/over/above the buffer layer 12. The nitride-based semiconductor layer 16A can be disposed on/over/above the nitride-based semiconductor layer 14A. The exemplary materials of the nitride-based semiconductor layer 14A can include, for example but are not limited to, nitrides or group III-V compounds, such as GaN, AlN, InN, $In_xAl_yGa_{(1-x-y)}N$ where x+y≤1, $Al_xGa_{(1-x)}N$ where x≤1. The exemplary materials of the nitride-based semiconductor layer 16A can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 14A and 16A are selected, such that the nitride-based semiconductor layer 16A has a bandgap (i.e., forbidden band width) greater/higher than a bandgap of the nitride-based semiconductor layer 14A, which causes electron affinities thereof different from each other and forms a heterojunction therebetween. For example, when the nitride-based semiconductor layer 14A is selected as an unintentionally-doped GaN layer (or can be referred to as an undoped GaN layer) having a bandgap of approximately 3.4 eV, the nitride-based semiconductor layer 16A can be selected as an AlGaN layer having bandgap of approximately 4.0 eV. As such, the nitride-based semiconductor layers 14A and 16A can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

The electrodes 20 and 22 can be disposed on/over/above the nitride-based semiconductor layer 16A. The electrodes 20 and 22 can be in contact with the nitride-based semiconductor layer 16A. In some embodiments, the electrode 20 can serve as a source electrode. In some embodiments, the electrode 20 can serve as a drain electrode. In some embodiments, the electrode 22 can serve as a source electrode. In some embodiments, the electrode 22 can serve as a drain electrode. The role of the electrodes 20 and 22 depends on the device design.

In some embodiments, the electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the electrodes 20 and 22 can include, for example but are not limited to, Ti, AlSi, TiN, or combinations thereof. Each of the electrodes 20 and 22 may be a single layer, or plural layers of the same or different composition. The electrodes 20 and 22 form ohmic contacts with the nitride-based semiconductor layer 16A. Furthermore, the ohmic contacts can be achieved by applying Ti, Al, or other suitable materials to the electrodes 20 and 22. In some embodiments, each of the electrodes 20 and 22 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The doped nitride-based semiconductor layer 32A can be disposed on/over/above the nitride-based semiconductor layer 16A. The doped nitride-based semiconductor layer 32A can be in contact with the nitride-based semiconductor layer 16A. The doped nitride-based semiconductor layer 32A can be disposed/located between the electrodes 20 and 22. The doped nitride-based semiconductor layer 32A can have, for example, a rectangular profile. In some embodiments, the doped nitride-based semiconductor layer 32A can have, for example, a trapezoid profile.

The gate electrode 34 can be disposed on/over/above the doped nitride-based semiconductor layer 32A. The gate electrode 34 can be in contact with the doped nitride-based semiconductor layer 32A, such that the doped nitride-based semiconductor layer 32A can be disposed/sandwiched between the gate electrode 34 and the nitride-based semiconductor layer 16A. The doped nitride-based semiconductor layer 32A has a pair of opposite side surfaces which are spaced apart from each other by a distance greater than a width of the gate electrode 34. The gate electrode 34 can be disposed/located between the electrodes 20 and 22. A distance between the electrode 22 and the gate electrode 34 is greater than a distance between the electrode 20 and the gate electrode 20. The gate electrode 34 and the doped nitride-based semiconductor layer 32A can serve as a gate structure.

In the exemplary illustration of FIG. 1A, the semiconductor device 1A is an enhancement mode device, which is in a normally-off state when the gate electrode 34 is at approximately zero bias. Specifically, the doped nitride-based semiconductor layer 32A may create at least one p-n junction with the nitride-based semiconductor layer 16A to deplete the 2DEG region, such that at least one zone of the 2DEG region corresponding to a position below the corresponding the gate electrode 34 has different characteristics (e.g., different electron concentrations) than the rest of the 2DEG region and thus is blocked.

Due to such mechanism, the semiconductor device 1A has a normally-off characteristic. In other words, when no voltage is applied to the gate electrode 34 or a voltage applied to the gate electrode 34 is less than a threshold voltage (i.e., a minimum voltage required to form an inversion layer below the gate electrode 34), the zone of the 2DEG region below the gate electrode 34 is kept blocked, and thus no current flows therethrough.

The exemplary materials of the doped nitride-based semiconductor layer 32A can be p-type doped. The doped nitride-based semiconductor layer 32A can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

In some embodiments, the gate electrode 34 may include metals or metal compounds. The gate electrode 34 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds. In some embodiments, the exemplary materials of the gate electrode 34 may include, for example but are not limited to, nitrides, oxides, silicides, doped semiconductors, or combinations thereof. The electrodes 20 and 22 and the gate electrode 34 can constitute a GaN-based HEMT device with the 2DEG region.

In some embodiments, the nitride-based semiconductor layer 14A includes undoped GaN and the nitride-based semiconductor layer 16A includes AlGaN, and the doped nitride-based semiconductor layer 32A is p-type GaN layer which can bend the underlying band structure upwards and to deplete the corresponding zone of the 2DEG region, so as to place the semiconductor device 1A into an off-state condition.

In order to avoid the breakdown phenomenon induced by a strong peak electric field near the edge of the gate electrode, multi-field plates (i.e., the number of the applied field plates is greater than two) are usually adopted in the semiconductor device to make the electric field distribution more uniform. However, the configuration of the excessive field plates may induce unwanted parasitic/stray capacitances which limits the maximum operating frequency of the device, thereby degrading the electrical properties and the reliability thereof. Moreover, the introduction of the multi-field plates would increase the process complexity of the device. Therefore, there is a need to improve device performance.

At least for avoiding the aforesaid issues, the present disclosure provides a novel way to suppress the breakdown phenomenon.

In embodiments of the present disclosure, negatively-charged ions, which are selected from a highly electronegative group, are regionally doped into the nitride-based semiconductor layer 16A (e.g., barrier layer) to modify the electrical properties thereof, thereby improving the electric field distribution in the semiconductor device 1A. The electronegativity of the selected element in the highly electronegative group is greater than that of nitrogen, such as fluorine (F) or chlorine (Cl). The detail mechanism is described as follows.

Referring to FIG. 1B, the doped nitride-based semiconductor layer 32A includes a central portion 322A, and a pair of opposite ledge portions 324A and 326A. The central portion 322A is directly under the gate electrode 34. A width of the central portion 322A can be defined by the gate electrode 34. The central portion 322A is covered by the gate electrode 34. The border of the central portion 322A coincides with opposite sidewalls of the gate electrode 34.

The central portion 322A is located between the ledge portions 324A and 326A. The ledge portions 324A and 326A are free from coverage of the gate electrode 34. The width of the ledge portion 324A is the same as that of the ledge portion 326A. In some embodiments, the width of the ledge portion 324A can be different from that of the ledge portion 326A. For instance, the width of the ledge portion 326A can be greater than that of the ledge portion 326A, such that the width design can match the distance relationship of the electrodes 20, 22 and the gate electrode 34, thereby improving the electrical properties of the semiconductor device 1A.

Referring to FIG. 1B, the nitride-based semiconductor layer 16A includes portions 162A, 164A, 166A, 168A and 169A. The portion 162A is beneath the central portion 322A. The portions 164A and 166A are beneath the portions 324A and 326A, respectively. The doped nitride-based semiconductor layer 32A has a left-side surface extending upward from an interface between the portions 164A and 168A. The doped nitride-based semiconductor layer 32A has a right-side surface extending upward from an interface between the portions 166A and 169A. The portions 168A and 169A abut against the portions 164A and 169A, respectively. The portion 168A has a top surface in a position lower than the portion 324A, such that the portions 168A and 324A can collectively form a step profile. The similar configuration can be applied to the portions 169A and 326A.

During the manufacturing process of the semiconductor device 1A, after forming the doped nitride-based semiconductor layer 32A and the gate electrode 34, an ion implantation process is performed on the resulted structure using the gate electrode 34 as a mask, in which the dopant applied to the ion implantation process can be selected from a highly electronegative group. In some embodiments, the highly electronegative group can include fluorine (F) or chlorine (Cl).

Doping concentration profiles along lines A-A', B-B', and C-C' are shown in FIG. 1B as well. Referring to the concentration profile along the line A-A', since the gate electrode 34 can block/hinder the dopants to dope into/enter the portions 162A and 322A during the ion implantation process, the doping concentration of the dopant in the portions 162A and 322A is zero or approaches to zero.

Furthermore, in other regions, the doping depth of the dopant can be well controlled by altering the ion implantation energy, such that most of the dopants can be doped into the portions 164A, 166A, 168A and 169A during the ion implantation process.

Referring to the concentration profile along the line B-B', the doping concentration of the dopant in the most part of ledge portions 324A and 326A is zero or approaches to zero. The ledge portion 324A and 326A has bottom parts near the portions 164A and 166A, respectively, and such the bottom parts are doped to have a doping concentration of the dopant linearly changing from zero to an non-zero constant along a thickness direction (e.g., the direction D2) thereof.

The doping concentration of the portions 164A and 166A of the nitride-based semiconductor layer 16A remains constant along a thickness direction (e.g., direction D2) thereof. Each of the ledge portions 324A and 326A of the doped nitride-based semiconductor layer 32A is doped to have a doping concentration of the dopant less than that of the portions 164A and 166A.

The nitride-based semiconductor layer 14A has a top portion beneath the portion 164A/166A of the nitride-based semiconductor layer 16A, and a doping concentration of the dopant of such the top portion linearly changing from an non-zero constant to zero along a thickness direction (e.g., direction D2) thereof.

As the negatively-charged ions introduced/implanted in the interstitial sites of the layers (e.g., the nitride-based semiconductor layer 16A), the negatively-charged ion selected from the highly electronegative group can become a negative fixed charge in the nitride-based semiconductor layer 16A, resulting in increase of the potential of the barrier layer. As such, zones of the 2DEG region directly beneath the portions 164A and 166A are depleted. Therefore, the density of the electric lines near the edge of the gate electrode 34 can be reduced, so as to alleviate the peak intensity of the electric field near the gate electrode 34, thereby suppressing the breakdown phenomenon. Hence, the semiconductor device 1A can have good electric properties instead of using field plates.

Moreover, in order to avoid the influence of negatively-charged ions on the rest of the 2DEG region in the semiconductor device 1A, the dopants in the portions 168A and 169A should be removed.

Specifically, after the ion implantation process, a dielectric layer 52 can be formed to cover the portions 324A and 326A, and the portions 168A, 169A are free from coverage of the dielectric layer 52. Then, an annealing process is performed to remove some of the dopants in the portions 168A and 169A of the nitride-based semiconductor layer 16A.

In this regard, referring to the concentration profile along the line C-C', the doping concentration of the portions 168A and 169A can be zero or approach to zero at top surfaces thereof. Such the concentration profile can be achieved by performing an annealing process.

It should be noted that the dielectric layer 52 can be formed on the portions 324A and 326A prior to the annealing process, so as to avoid the dopant heat diffusing from the portions 324A and 326A due to the annealing process. Since the dopants can be removed from the portions 168A and 169A by performing the annealing process, the corresponding zones of the 2DEG region can be free from obstruction by the dopants.

After the ion implantation process and the annealing process, the dopants can retain/remain in the portions 164A and 166A, instead of the portions 168A and 169A, and most of the portion 162A. The doping concentration of the portions 168A and 169A is zero or approaches to zero due to the annealing process. The doping concentration of the most of the portion 162A of the nitride-based semiconductor layer is zero or approaches to zero due to the block of the gate electrode 34 during the ion implantation process.

In some embodiments, the portion 162A has a part abutting against the portion 164A/166A, the doping concentration of such the part linearly changes along a width direction (e.g., the direction D1) thereof. The doping concentration of the portion 168A/169A is less than that of the portion 164A/166A due to annealing process. The doping concentration from the portion 168A to the portion 169A sequentially remains zero, increases to an non-zero constant, remains the non-zero constant, decreases to zero, remains to zero, increases to the non-zero constant, remains the non-zero constant, and then decreases to zero along the direction D1. In some embodiments, the increase/decrease of the doping concentration of the nitride-based semiconductor layer 16A is continuous.

The reason for the distribution of the doping concentration is to shape the depletion region for the 2DEG region. In case the distribution density is too high, the resistivity will get high as well, which is not advantageous on-resistant for devices. In case the distribution density is too low, the normally-off state is hard to keep effective, which will result in leakage current issue.

Referring to FIGS. 1A and 1B, the dielectric layer 50 can be disposed on/over/above the gate electrode 34. The dielectric layer 50 has a pair of opposite side surfaces which connect two opposite side surfaces of the gate electrode 34, respectively. The exemplary materials of the dielectric layer 50 can include, for example but are not limited to, dielectric materials. For example, the dielectric layer 50 can include $SiN_x$, $SiO_x$, SiON, SiC, SiBN, SiCBN, oxides, nitrides, plasma enhanced oxide (PEOX), or combinations thereof.

The dielectric layer 52 can be disposed on/over/above the doped nitride-based semiconductor layer 32A. The dielectric layer 52 covers the side surfaces of the gate electrode 34 and the dielectric layer 50. The dielectric layer 52 covers the ledge portions 324A and 326A of the doped nitride-based semiconductor layer 32A, and two opposite side surfaces of the doped nitride-based semiconductor layer 32A are free from coverage by the dielectric layer 52. The exemplary materials of the dielectric layer 52 can be identical to or similar to that of the dielectric layer 50.

The dielectric layer 54 can be disposed on/over/above the nitride-based semiconductor layer 16A, and covers the dielectric layer 52 so as to form a protruding portion. The dielectric layer 54 has a plurality of through holes TH to expose the nitride-based semiconductor layer 16A. The electrodes 20 and 22 can extend through the through holes TH (i.e., the electrodes 20 and 22 penetrate the dielectric layer 54), so as to make contact with the nitride-based semiconductor layer 16A. The exemplary materials of the dielectric layer 54 can be identical to or similar to that of the dielectric layer 50.

The passivation layer 60 can be disposed on/over/above the electrodes 20, 22, and the dielectric layer 54. The exemplary material of the passivation layer 60 can be can be identical with or similar with that of the passivation layer 60. Moreover, the passivation layer 60 can serve as a planarization layer which has a level top surface to support other layers/elements. In some embodiments, the passivation layer 60 can be formed as a thicker layer, and a planarization process, such as chemical mechanical polish (CMP) process, is performed on the passivation layer 60 to remove the excess portions, thereby forming a level top surface.

The contact vias 70 are disposed within the passivation layer 60. The contact vias 70 can penetrate the passivation layer 60. The contact vias 70 can extend longitudinally to connect the electrodes 20 and 22. The contact via 72 is located directly on/over/above the gate electrode 34. The contact via 72 penetrates the dielectric layers 50, 52 and 54, and the passivation layer 60, so as to connect the gate electrode 34. The upper surfaces of the contact vias 70 and 72 are free from coverage of the passivation layer 60. The exemplary materials of the contact vias 70 and 72 can include, for example but are not limited to, conductive materials, such as metals or alloys.

The patterned circuit layer 80 can be disposed on/over/above the passivation layer 60 and the conductive vias 70 and 72. The patterned circuit layer 80 is in contact with the conductive vias 70 and 72. The patterned circuit layer 80 may have metal lines, pads, traces, or combinations thereof, such that the patterned circuit layer 80 can form at least one circuit. The exemplary materials of the patterned circuit layer 80 can be identical to or similar with that of the contact vias 70 and 72.

Different stages of a method for manufacturing the semiconductor device 1A are shown in FIG. 2A, FIG. 2B, FIG. 2C, FIG. 2D, FIG. 2E, FIG. 2F, FIG. 2G and FIG. 2H, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
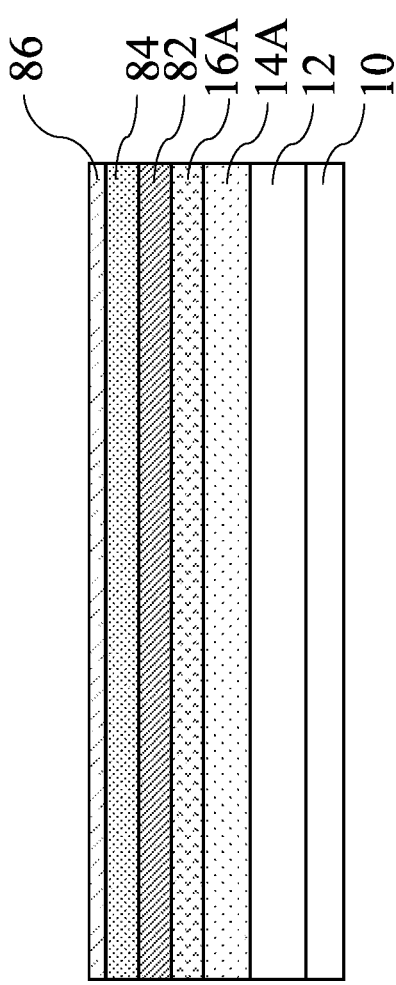

Referring to FIG. 2A, a buffer layer 12 can be formed on/over/above a substrate 10 by using deposition techniques. A nitride-based semiconductor layer 14A can be formed on/over/above the buffer layer 12 by using deposition techniques. A nitride-based semiconductor layer 16A can be formed on/over/above the nitride-based semiconductor layer 14A by using deposition technique, so that a heterojunction is formed therebetween. A blanket doped nitride-based semiconductor layer 82 can be formed on/over/above the nitride-based semiconductor layer 16A. A blanket gate electrode layer 84 can be formed on/over/above the blanket doped nitride-based semiconductor layer 82. The materials of the blanket gate electrode layer 84 can be conductive materials; and therefore, the blanket gate electrode layer 84 can serve as a blanket conductive layer. A blanket dielectric layer 86 can be formed on/over/above the blanket gate electrode layer 84.

Figure 2B:
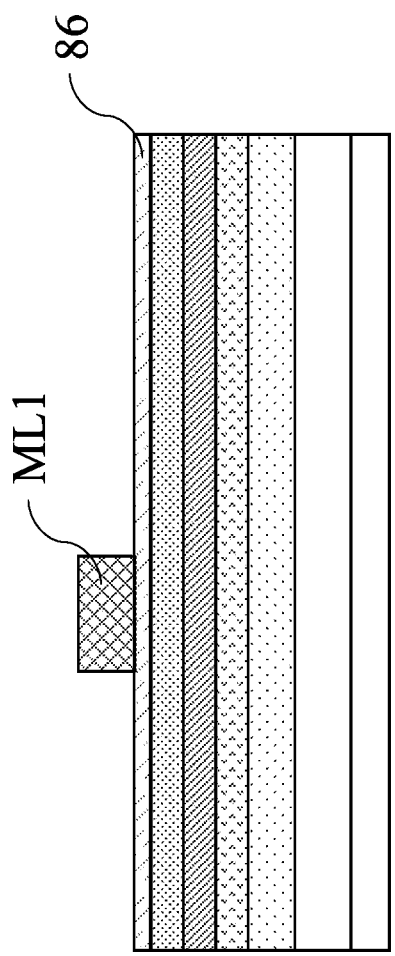

Referring to FIG. 2B, a mask layer ML1 can be formed on the blanket dielectric layer 86. The formation of the mask layer ML1 may include a pattering process. After the pattering process, some portions of the blanket dielectric layer 86 can be exposed.

Figure 2C:
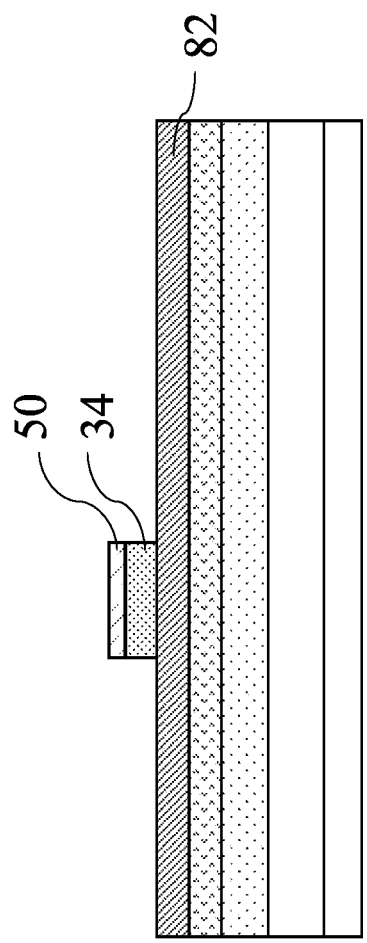

Referring to FIG. 2C, a patterning process is performed on the blanket gate electrode layer 84 and the blanket dielectric layer 86, so as to form a gate electrode 34 and a dielectric layer 50. The gate electrode 34 is covered by the dielectric layer 50. At least a part of the blanket doped nitride-based semiconductor layer 82 is exposed by the gate electrode 34 and the dielectric layer 50.

Figure 2D:
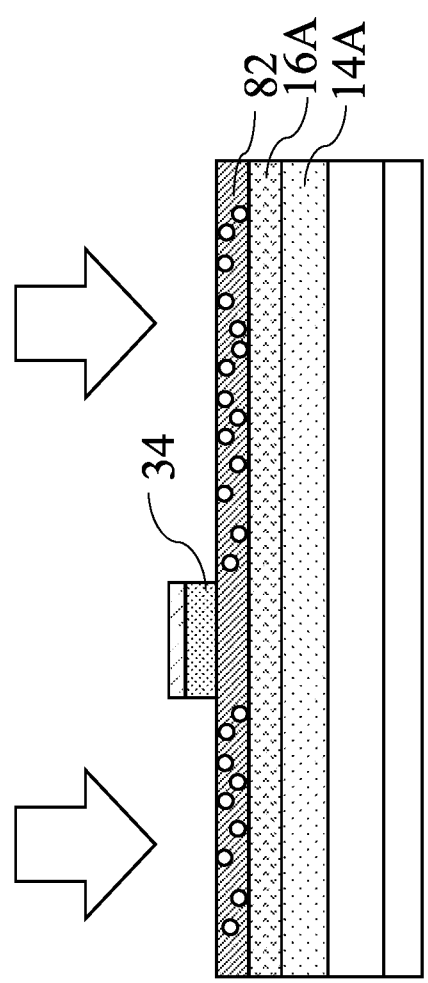

Referring to FIG. 2D, an ion implantation process is performed using the gate electrode 34 as a mask, such that at least one portion of the nitride-based semiconductor layer 16A beneath the exposed blanket doped nitride-based semiconductor layer 82 is doped with dopants selected from a highly electronegative group, which are depicted as small particle. In some embodiments, at least one portion of the blanket doped nitride-based semiconductor layer 82 is doped with the dopants. In some embodiments, the highly electronegative group can include fluorine (F) or chlorine (Cl). In this regard, the doping depth of the dopants can be adjusted by altering the ion implantation energy, such that most of the dopants can be doped into the nitride-based semiconductor layer 16A. In some embodiments, the dopants can be doped into a part of the blanket doped nitride-based semiconductor layer 82 adjacent to the nitride-based semiconductor layer 16A. In some embodiments, the dopants can be doped into a part of the nitride-based semiconductor layer 14A adjacent to the nitride-based semiconductor layer 16A.

Figure 2E:
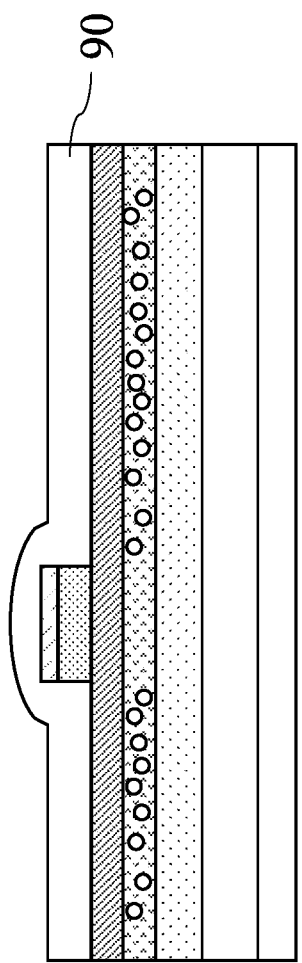

Referring to FIG. 2E, a blanket dielectric layer 90 can be formed to cover the resulted structure in the FIG. 2D.

Figure 2F:
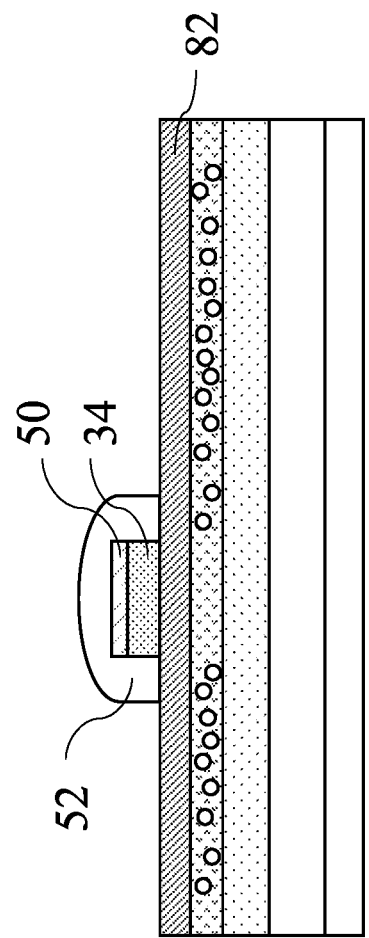

Referring to FIG. 2F, a patterning process is performed on the blanket dielectric layer 90, so as to form the dielectric layer 52 to cover the gate electrode 34 and the dielectric layer 50, thereby exposing at least a part of the blanket doped nitride-based semiconductor layer 82.

Referring to FIG. 2G, a patterning process is performed on the blanket doped nitride-based semiconductor layer 82, so as to remove excess portions of the exposed blanket doped nitride-based semiconductor layer 82, thereby forming the doped nitride-based semiconductor layer 32A. At least a part of the nitride-based semiconductor layer 16A can be exposed thereof. The doped nitride-based semiconductor layer 32A is formed to be wider than the gate electrode 34.

Then, an annealing process can be performed to remove dopants in the exposed nitride-based semiconductor layer 16A. The dopants in the portion of the nitride-based semiconductor layer 16A directly under the doped nitride-based semiconductor layer 32A can still retain/remain due to the coverage of the dielectric layer 52 during the annealing process.

Referring to FIG. 2H, a dielectric layer 54 can be formed to cover the resulted structure in the FIG. 2G, so as to expose at least a part of the nitride-based semiconductor layer 16A. The formation of the dielectric layer 54 includes deposition techniques and a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof. Thereafter, the electrodes 20 and 22, contact vias 70 and 72, a passivation layer 60, and a patterned circuit layer 80 can be formed, obtaining the configuration of the semiconductor device 1A as shown in FIG. 1A.

Figure 3:
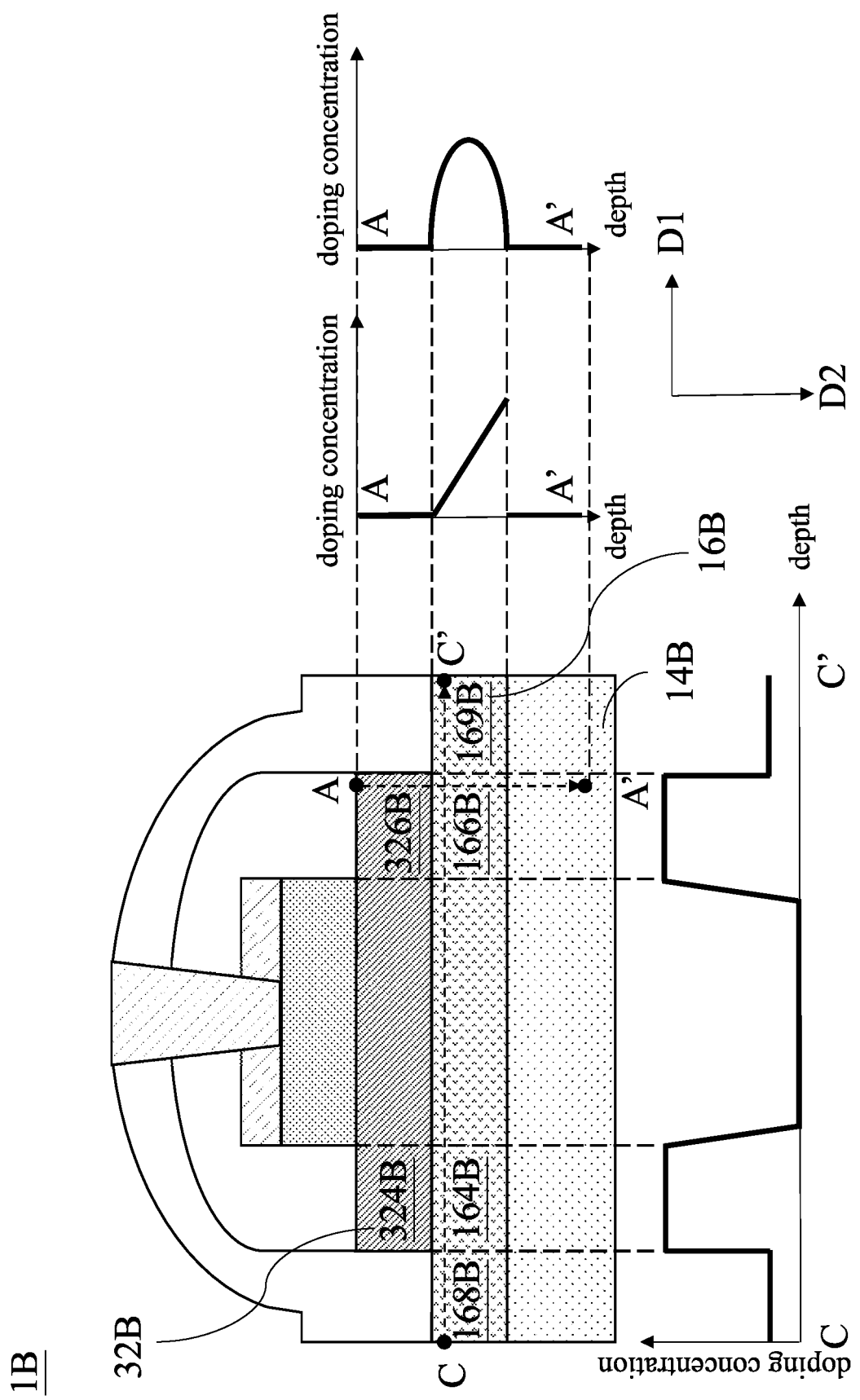
FIG. 3 is an enlarged vertical cross-sectional view of a region of a semiconductor device according to some embodiments of the present disclosure.

FIG. 3 is an enlarged vertical cross-sectional view of a region of a semiconductor device 1B according to some embodiments of the present disclosure. The directions D1 and D2 are illustrated in FIG. 3. The semiconductor device 1B is similar to the semiconductor device 1A as described and illustrated with reference to FIG. 1A and FIG. 1B. In the present embodiment, the doping concentration profile differs than the previous one.

In the present embodiment, the doping concentration of the whole portions 324B and 326B is zero or approaches to zero. The doping concentration of the whole nitride-based semiconductor layer 14B is zero or approaches to zero.

Referring to the concentration profile along the line A-A', the doping concentration of the portion 166B of the nitride-based semiconductor layer 16B can linearly change along a thickness direction (e.g., direction D2) thereof. Alternatively, the doping concentration of the portion 166B of the nitride-based semiconductor layer 16B can increase first and then decrease along a thickness direction (e.g., direction D2) thereof. The graph of the relationship between the doping concentration and the depth can be curved.

Referring to the concentration profile along the line C-C', the doping concentration of the portions 168B and 169B is greater than zero. That is, the doping concentration of the portions 168B and 169B can be greater than the portion of the nitride-based semiconductor layer 16B between the portions 164B and 166B.

During the manufacturing process of the semiconductor device 1B, the aforesaid doping profile of the dopants can be controlled by turning the parameters. In some embodiments, the parameters may include ion implantation energy. In some embodiments, the parameters may include profile of reticles, such as a gray-tone mask or a half-tone mask, so as to adjust ion implantation energy during the ion implantation process. In some embodiments, the parameters may include applied time of an annealing process.

FIG. 4 is a vertical cross-sectional view of a semiconductor device 1C according to some embodiments of the present disclosure. The semiconductor device 1C is similar to the semiconductor device 1A as described and illustrated with reference to FIG. 1A, except the nitride-based semiconductor layer 16A is replaced by a nitride-based semiconductor layer 16C.

The nitride-based semiconductor layer 16C includes portions 162C, 164C, and 169C. The portion 162C is directly beneath the gate electrode 34. The portion 164C is located between the portions 162C and 169C. The portion 169C of the nitride-based semiconductor layer 16C has a top surface in a position lower than the portion 164C and the central portion 162C. The portions 162C, 164C and 169C can collectively form a step profile.

During the manufacturing process of the semiconductor device 1C, a patterning process for the doped nitride-based semiconductor layer 32C can further remove some top portions of the nitride-based semiconductor layer 16C. The removal of the top portions of the nitride-based semiconductor layer 16C can form the step profile. Such the profile is advantageous to control the distribution of the dopants.

Figure 5A:
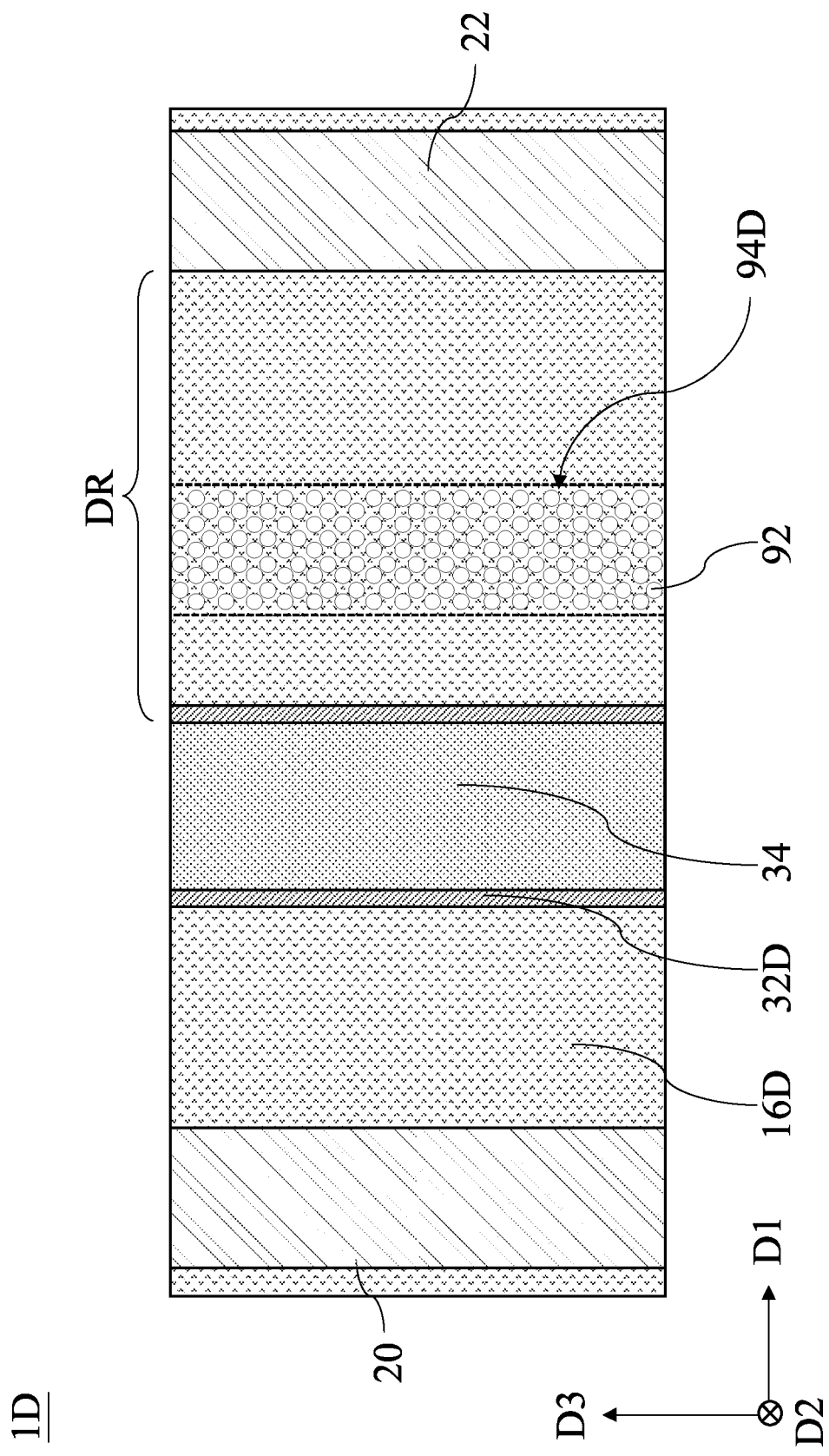
FIG. 5A is a top view of a semiconductor device according to some embodiments of the present disclosure.
Figure 5B:
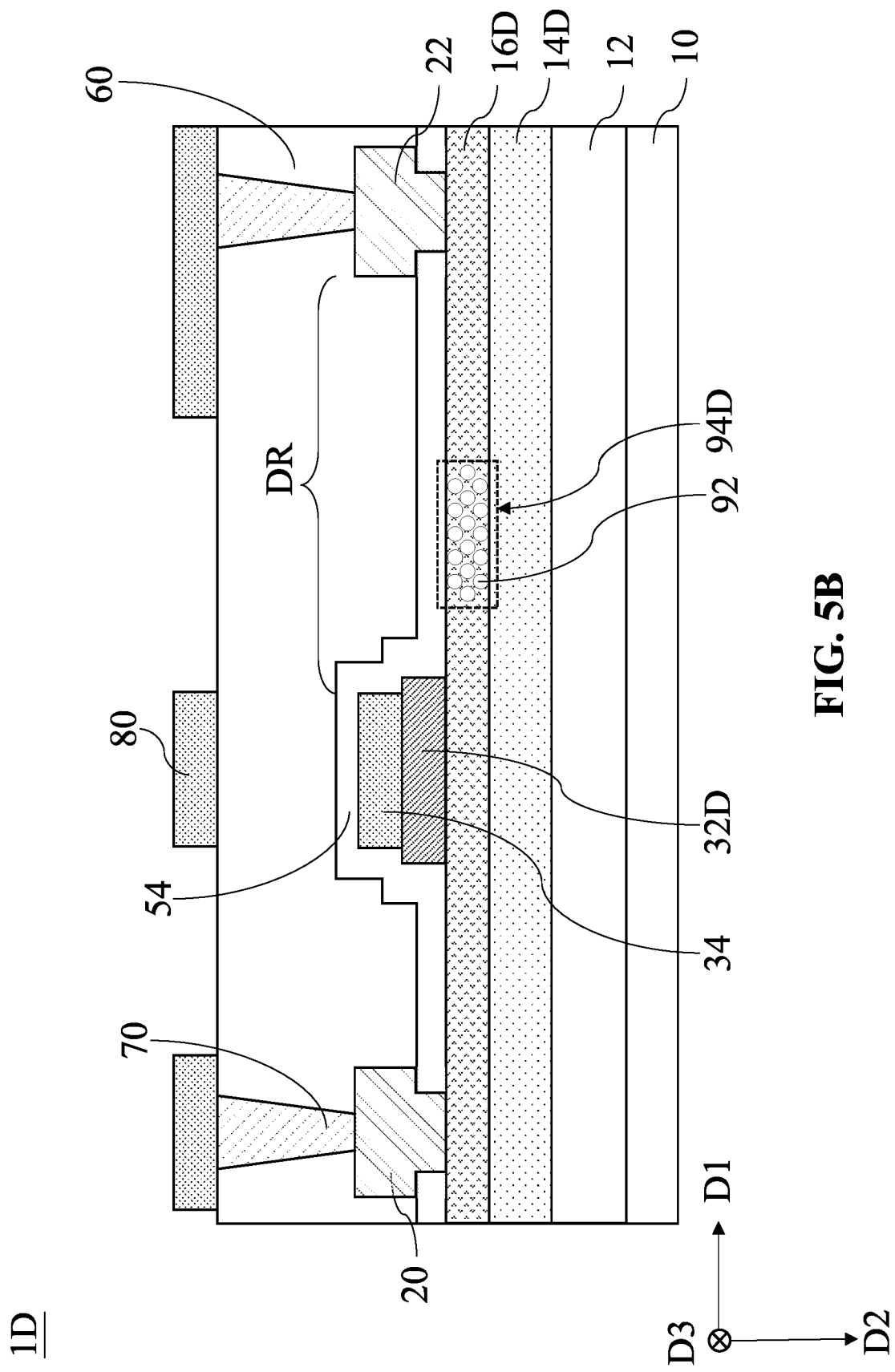
FIG. 5B is a vertical cross-sectional view of the semiconductor device in FIG. 5A.

FIG. 5A is a top view of a semiconductor device 1D according to some embodiments of the present disclosure. FIG. 5B is a vertical cross-sectional view of the semiconductor device 1D in FIG. 5A. The semiconductor device 1D is similar to the semiconductor device 1A as described and illustrated with reference to FIG. 1A, except distribution of negatively-charged ions is varied. The directions D1, D2, and D3 are labeled in the FIGS. 5A and 5B. The directions D1, D2 and D3 are different from each other. In some embodiments, the directions D1, D2 and D3 are perpendicular to each other.

The semiconductor device 1D includes a substrate 10, a buffer layer 12, nitride-based semiconductor layers 14D and 16D, electrodes 20 and 22, a doped nitride-based semiconductor layer 32D, a gate electrode 34, a dielectric layer 54, a passivation layer 60, contact vias 70, a patterned circuit layer 80, a group of negatively-charged ions 92. The descriptions for the identical or similar layers as afore mentioned are omitted.

A drift region DR is defined between the gate electrode 34 and the electrode 22. A group of negatively-charged ions 92, which are selected from a highly electronegative group, are implanted/doped into the drift region DR and over the 2DEG region in the nitride-based semiconductor layer 14D, such that a high resistivity zone 94D is formed by the group of negatively-charged ions 92. The high resistivity zone 94D is embedded in the nitride-based semiconductor layer 16D (e.g., the barrier layer).

The doped nitride-based semiconductor layer 32D and the gate electrode 34 are vertically spaced apart/separated from the negatively-charged ions 92. The doped nitride-based semiconductor layer 32D and the gate electrode 34 are vertically spaced apart/separated from the high resistivity zone 94D. The negatively-charged ions 92 are spaced apart from an area/a region directly beneath the gate electrode 32 and the electrode 22. The negatively-charged ions 92 are adjacent with an interface formed between the nitride-based semiconductor layer 16D and the dielectric layer 54. The high resistivity zone 94D is spaced apart from the electrodes 20 and 22. The gate electrode 34 is vertically and horizontally separated from the high resistivity zone 94D. The gate electrode 34 is closer to the negatively-charged ions 92 than the electrode 22, such that the negatively-charged ions 92 can deplete at least one portion of the 2DEG region which is near the gate electrode 34, thereby rearranging/redistributing the electrical field distribution therein.

Hence, the density of the electric lines near the edge of the gate electrode 34 can be reduced, so as to alleviate the peak intensity of the electric field near the gate electrode 34, thereby suppressing the breakdown phenomenon. The semiconductor device 1D can have good electric properties instead of applying field plate.

Referring to FIG. 5A, from the top view of the semiconductor device 1A, the gate electrode 34 and the electrodes 20, 22 can extend along the direction D3. The negatively-charged ions 92 are distributed along the direction D3 to form a continuous high resistivity strip 94 in the drift region DR. The high resistivity zone 94D, the gate electrode 34, the electrode 20, and the electrode 22 extend along the same direction D3.

Figure 5C:
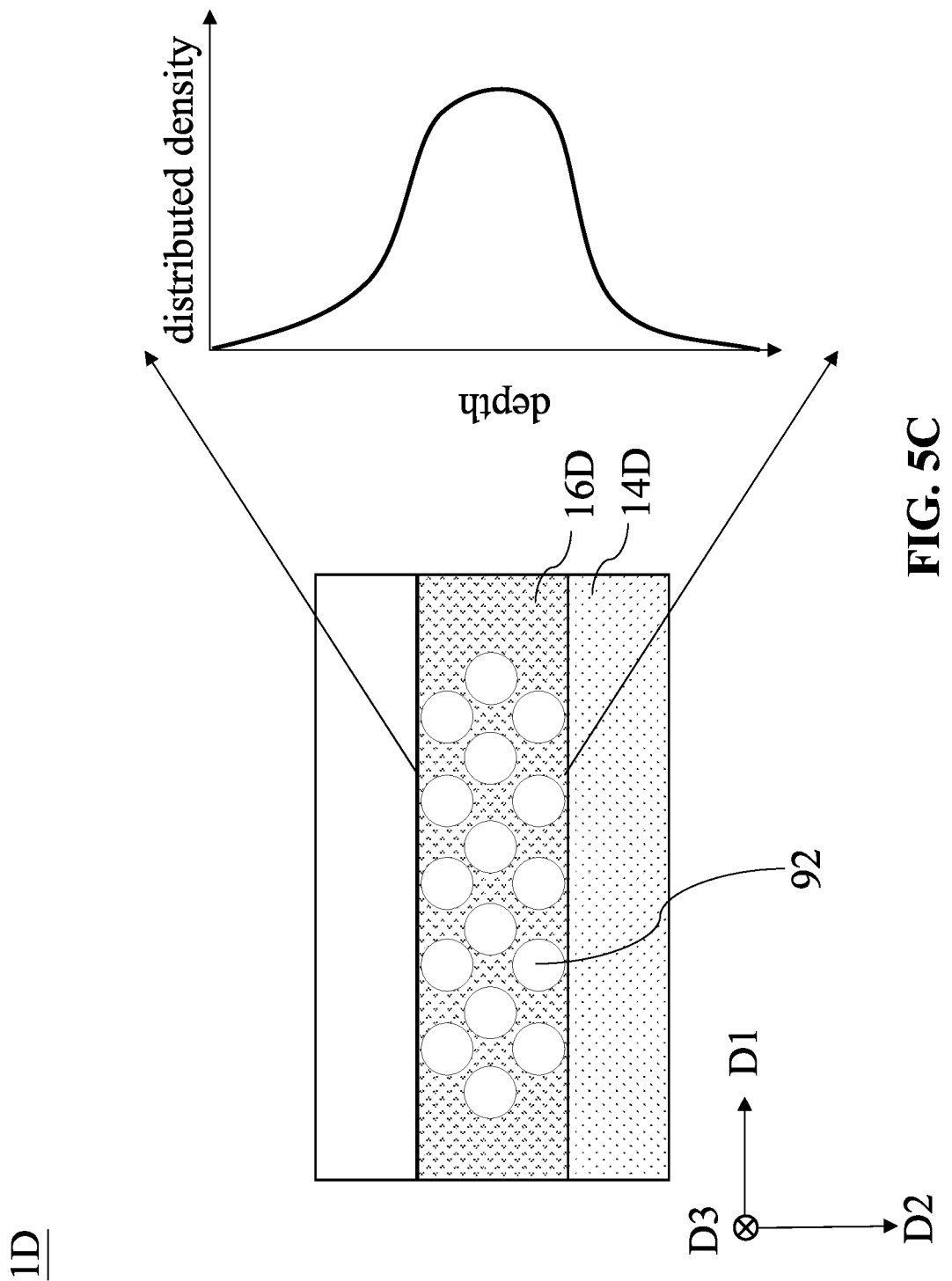
FIG. 5C is a distribution of the negatively-charged ions in a region of the semiconductor device in the FIG. 5B.

FIG. 5C is a distribution of the negatively-charged ions in a region of the semiconductor device 1D in the FIG. 5B. The negatively-charged ions 92 are distributed from a top surface to a bottom surface of the nitride-based semiconductor layer 16D. The distributed density of the negatively-charged ions 92 changes from the top surface to the bottom surface of the nitride-based semiconductor layer 16D. The distributed density of the negatively-charged ions 92 in the nitride-based semiconductor layer 16D is non-uniform along the direction D2 pointing from the top surface to the bottom surface of the nitride-based semiconductor layer 16D (i.e., a direction pointing from the dielectric layer 54 toward the nitride-based semiconductor layer 16D). The distributed density of the negatively-charged ions 92 in the nitride-based semiconductor layer 16D increases first and then decreases along the direction D2. In some embodiments, the distribution of the negatively-charged ions 92 along a thickness direction (e.g., the direction D2) of the nitride-based semiconductor layer 16D can be a normal distribution.

The reason for such the distributed density is to shape the depletion region for the 2DEG region. In case the distributed density is too high, the resistivity will get high as well, which is not advantageous on-resistant for devices. In case the distributed density is too low, the normally-off state is hard to keep effective so at least one leakage current occurs. With such the distributed density as shown in FIG. 5C, the semiconductor device 1D is allowed to become free from any field plate in the structure, thereby avoiding the issues of process complexity caused by the field plate. Accordingly, the structure as shown in FIG. 5B does not include any field plate. In the present disclosure, whether to introduce a field plate in the structure of the semiconductor device 1D is not limited.

In some embodiments, the distribution of the negatively-charged ions 92 can be determined by the implantation energy of the ion implantation process. For example, by controlling the implantation energy, the negatively-charged ions can be doped into the nitride-based semiconductor layer 16D, such that the negatively-charged ions 92 can be spaced apart from the top and the bottom surfaces of the nitride-based semiconductor layer 16D.

Different stages of a method for manufacturing the semiconductor device 1D are shown in FIG. 6A, FIG. 6B, FIG. 6C, and FIG. 6D, as described below.

Figure 6A:
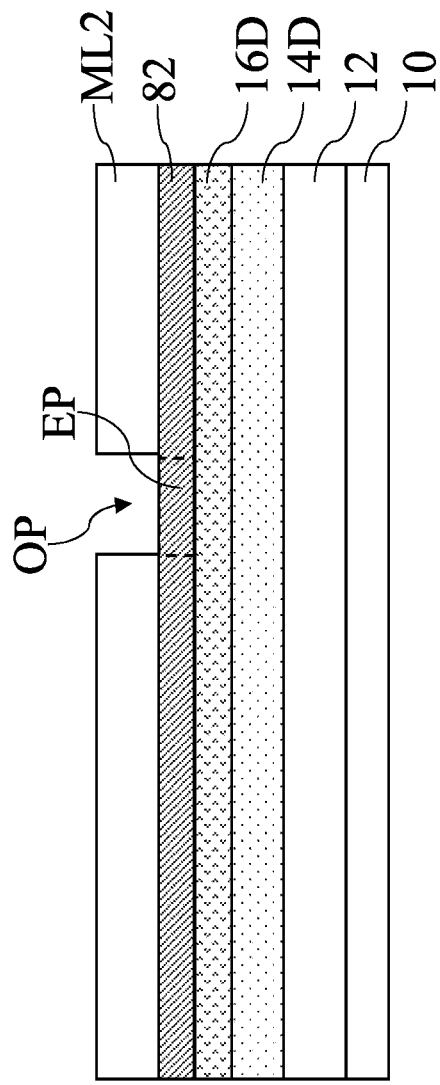
FIG. 6A, FIG. 6B, FIG. 6C, and FIG. 6D show different stages of a method for manufacturing a semiconductor device according to some embodiments of the present disclosure.

Referring to FIG. 6A, a buffer layer 12 can be formed on/over/above a substrate 10 by using deposition techniques. A nitride-based semiconductor layer 14D can be formed on/over/above the buffer layer 12 by using deposition techniques. A nitride-based semiconductor layer 16D can be formed on/over/above the nitride-based semiconductor layer 14D by using deposition technique, so that a heterojunction is formed therebetween. A blanket doped nitride-based semiconductor layer 82 can be formed on/over/above the nitride-based semiconductor layer 16D. A mask layer ML2 with at least one opening OP is formed on the blanket doped nitride-based semiconductor layer 82. The opening OP of the mask layer ML2 can expose at least one portion EP of the blanket doped nitride-based semiconductor layer 82, in which the opening OP of the mask layer ML2 is strip-shaped.

Figure 6B:
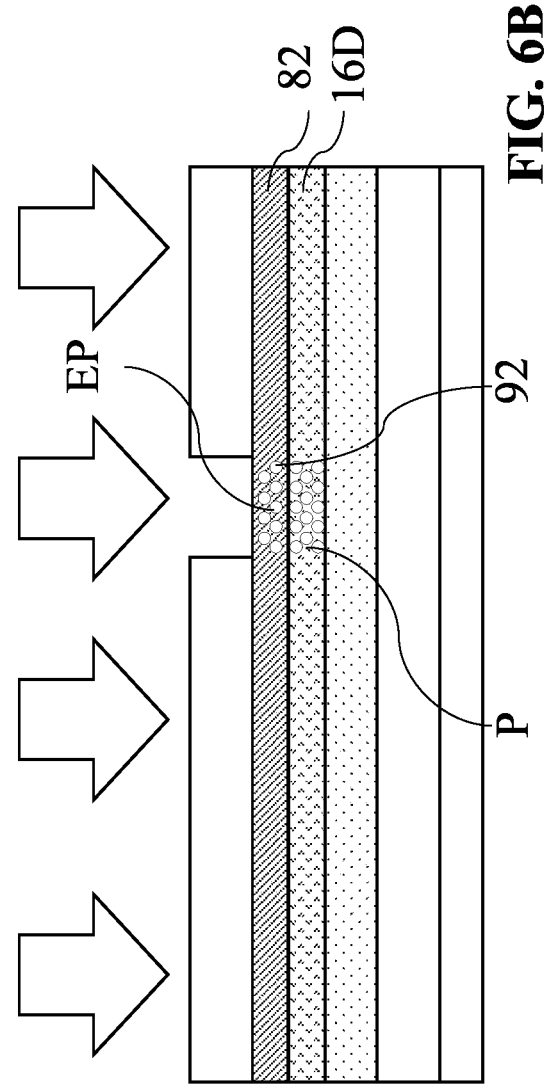

Referring to FIG. 6B, an ion implantation process is performed using negatively-charged ions 92 to distribute the negatively-charged ions 92. The negatively-charged ions 92 are distributed in the exposed portion EP of the blanket doped nitride-based semiconductor layer 82. The negatively-charged ions 92 are distributed in a portion P of the nitride-based semiconductor layer 16D beneath the exposed portion EP of the blanket doped nitride-based semiconductor layer 82.

Figure 6C:
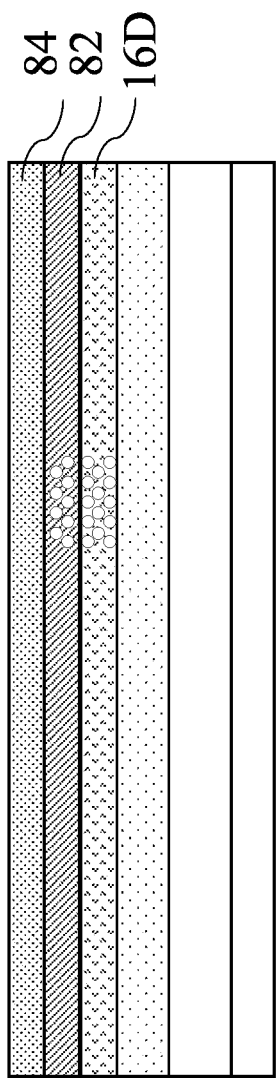

Referring to FIG. 6C, the mask layer ML2 is removed from the blanket doped nitride-based semiconductor layer 82. A blanket gate electrode layer 84 is formed on the blanket doped nitride-based semiconductor layer 82.

Figure 6D:
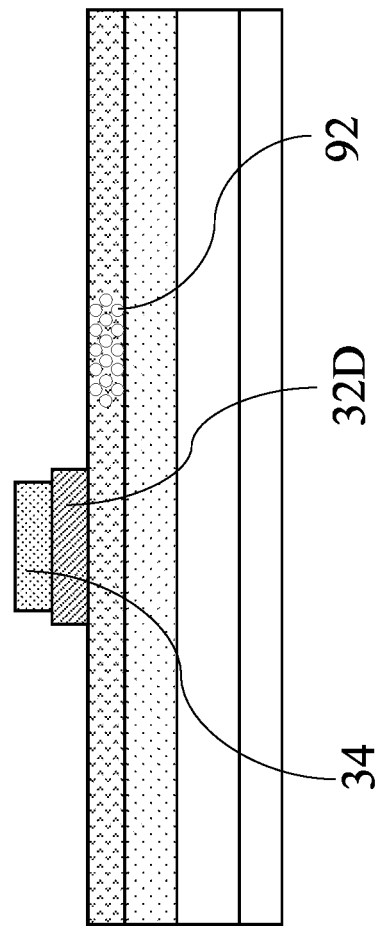

Referring to FIG. 6D, a patterning process is performed on the blanket doped nitride-based semiconductor layer 82, such that the exposed portion EP of the blanket doped nitride-based semiconductor layer 82 is removed. Thus, a doped nitride-based semiconductor layer 32D is formed, and the formed doped nitride-based semiconductor layer 32D is spaced apart from the negatively-charged ions 92. A gate electrode 34 (e.g., gate electrode layer) is formed on/over/above the doped nitride-based semiconductor layer 32D, and is spaced apart from the negatively-charged ions 92. The formation of the gate electrode 34 includes deposition techniques and a patterning process. Thereafter, the electrodes 20 and 22, contact vias 70 and 72, a dielectric layer 54, a passivation layer 60, and a patterned circuit layer 80 can be formed, obtaining the configuration of the semiconductor device 1D as shown in FIG. 5B.

Figure 7:
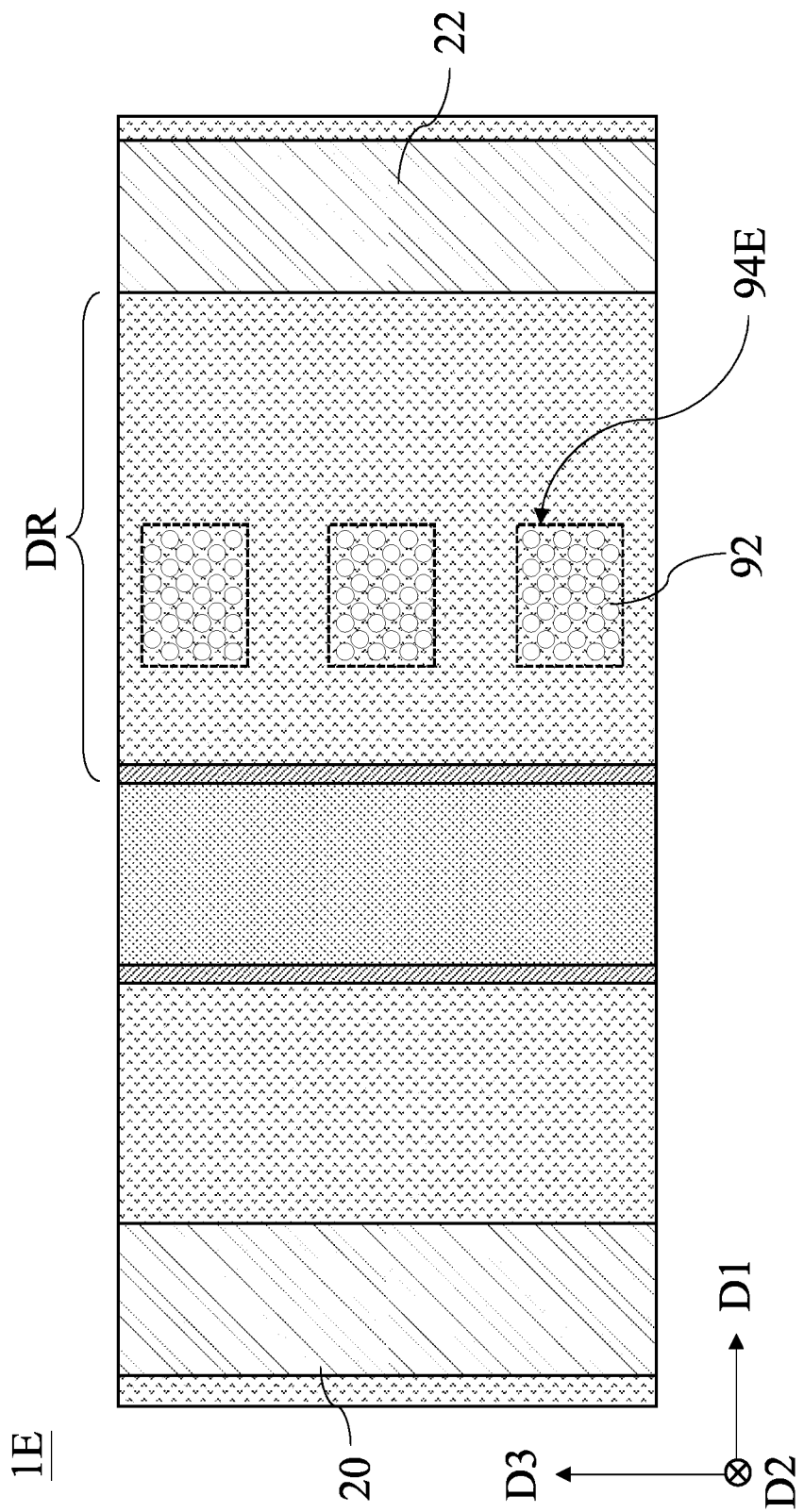
FIG. 7 is a top view of a semiconductor device according to some embodiments of the present disclosure.

FIG. 7 is a top view of a semiconductor device 1E according to some embodiments of the present disclosure. The semiconductor device 1E is similar to the semiconductor device 1D as described and illustrated with reference to FIG. 5A, except the high resistivity zone 94D is replaced by a plurality of separated high resistivity zones 94E.

In the present embodiment, the negatively-charged ions 92 are distributed along the direction D3, which is the same as the extending direction of the electrodes 20 and 22. In response to the negatively-charged ions 92, the high resistivity zones 94E are formed in the drift region DR. The high resistivity zones 94E are arranged along the direction D3. Each of the high resistivity zones 94E is in a shape of rectangular from the top view of the semiconductor device 1E.

Figure 8:
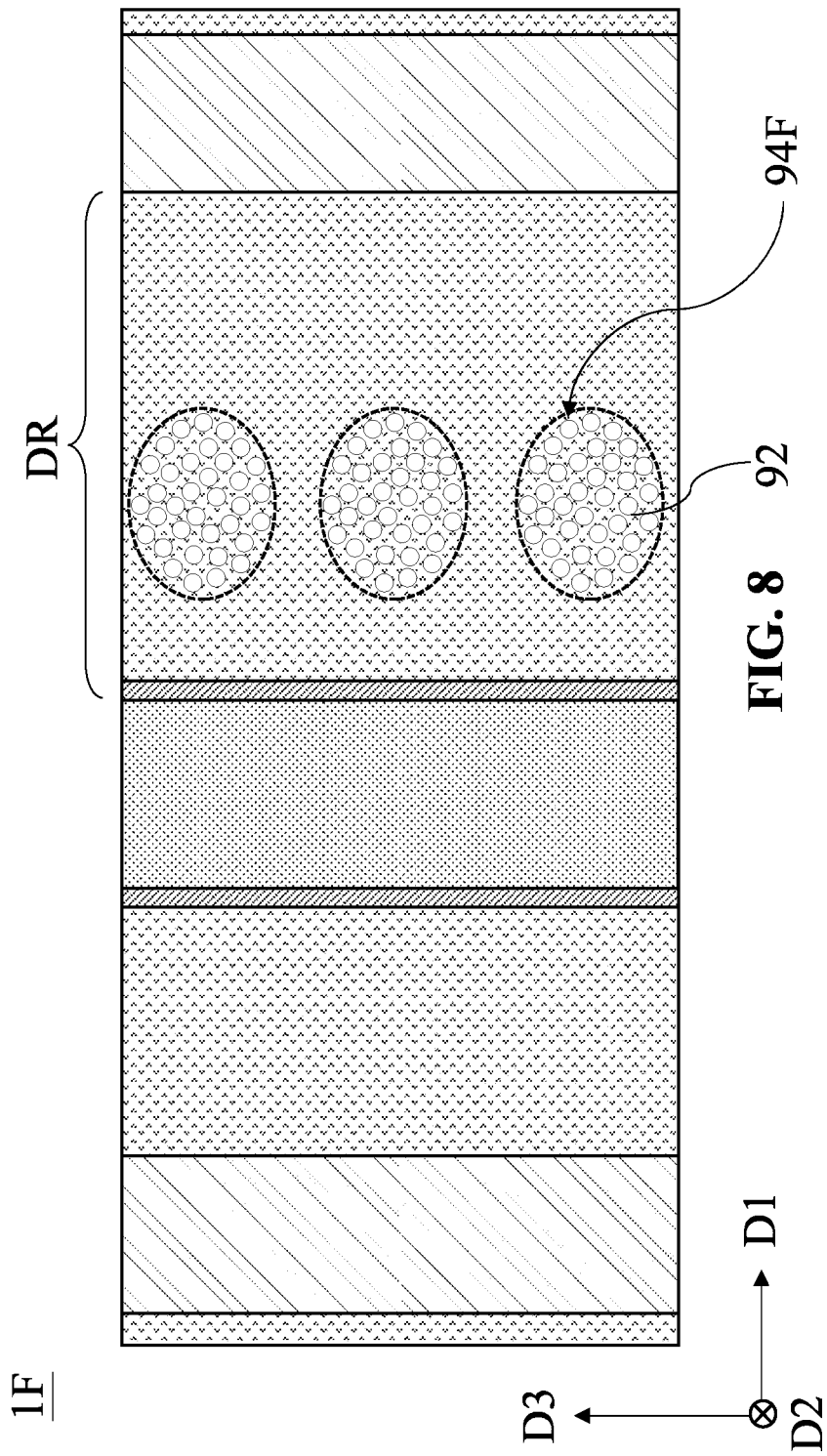
FIG. 8 is a top view of a semiconductor device according to some embodiments of the present disclosure.

FIG. 8 is a top view of a semiconductor device 1F according to some embodiments of the present disclosure. The semiconductor device 1F is similar to the semiconductor device 1D as described and illustrated with reference to FIG. 5A, except the high resistivity zone 94D is replaced by a plurality of separated high resistivity zones 94F.

In the present embodiment, the negatively-charged ions 92 are distributed along the direction D3, which is the same as the extending direction of the electrodes 20 and 22. In response to the negatively-charged ions 92, the high resistivity zones 94F are formed in the drift region DR. The high resistivity zones 94F are arranged along the direction D3. Each of the high resistivity zones 94F is in a shape of ellipse from the top view of the semiconductor device 1F. In some embodiments, each of the high resistivity zones 94F is in a shape of circle from the top view of the semiconductor device 1F.

Figure 9:
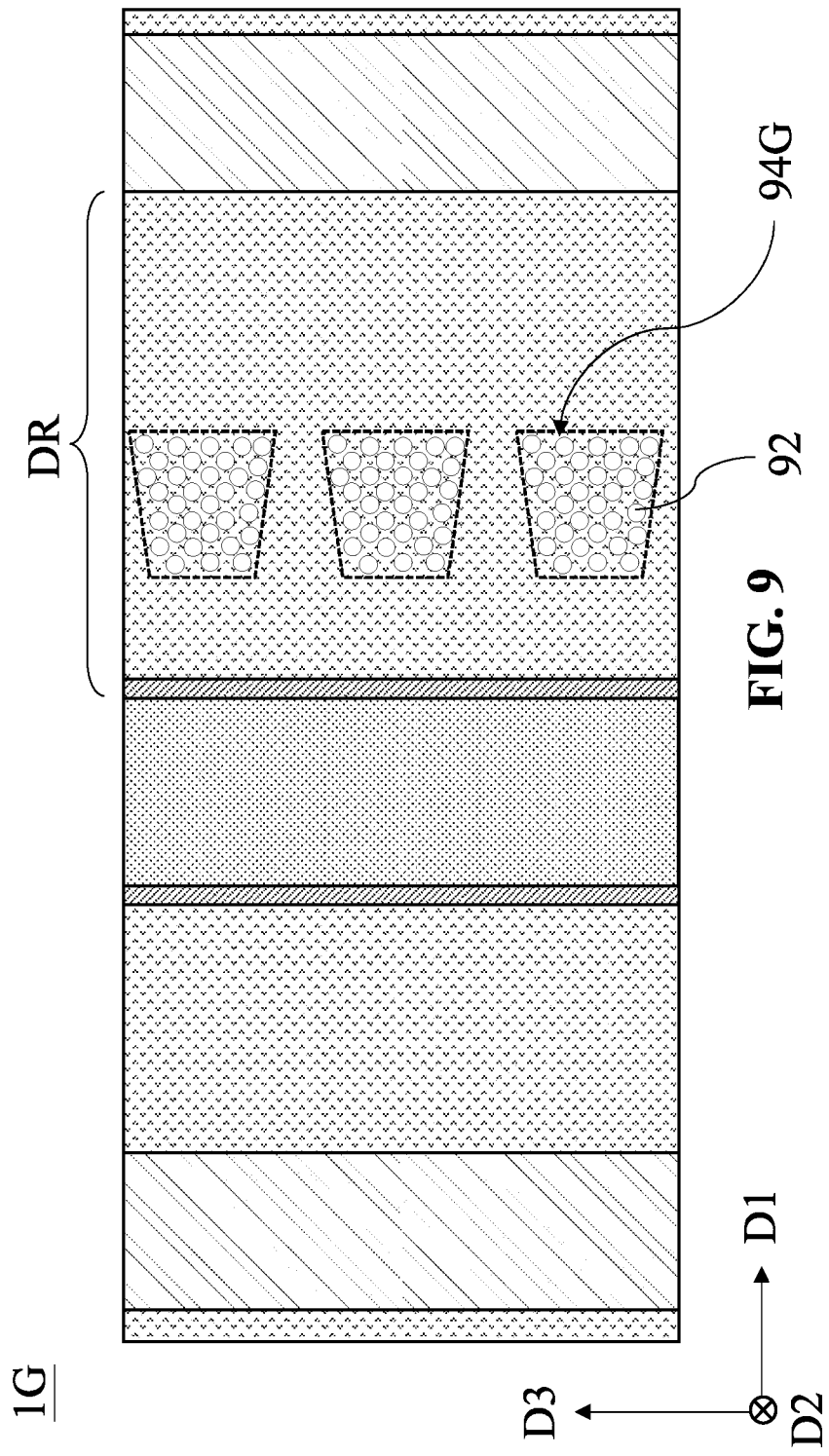
FIG. 9 is a top view of a semiconductor device according to some embodiments of the present disclosure.

FIG. 9 is a top view of a semiconductor device 1G according to some embodiments of the present disclosure. The semiconductor device 1G is similar to the semiconductor device 1D as described and illustrated with reference to FIG. 5A, except the high resistivity zone 94D is replaced by a plurality of separated high resistivity zones 94G.

In the present embodiment, the negatively-charged ions 92 are distributed along the direction D3, which is the same as the extending direction of the electrodes 20 and 22. In response to the negatively-charged ions 92, the high resistivity zones 94G are formed in the drift region DR. The high resistivity zones 94G are arranged along the direction D3. Each of the high resistivity zones 94G has a short side and a long side between the short side and the electrode 22. Specifically, each of the high resistivity zones 94G is in a shape of trapezoid from the top view of the semiconductor device 1G.

With respect to the semiconductor devices 1E, 1F and 1G, the high resistivity zones 94E/94F/94G are formed to be separated from each other, and the overall resistance thereof can be reduced.

During the manufacturing process of the semiconductor device 1E, 1F and 1G, the mask layer applied in the ion implantation process has a plurality of the separated openings OP to expose the blanket doped nitride-based semiconductor layer thereunder. The shape of the high resistivity zone in the top view of the corresponded semiconductor device can be determined by the shape of the openings OP.

Figure 10A:
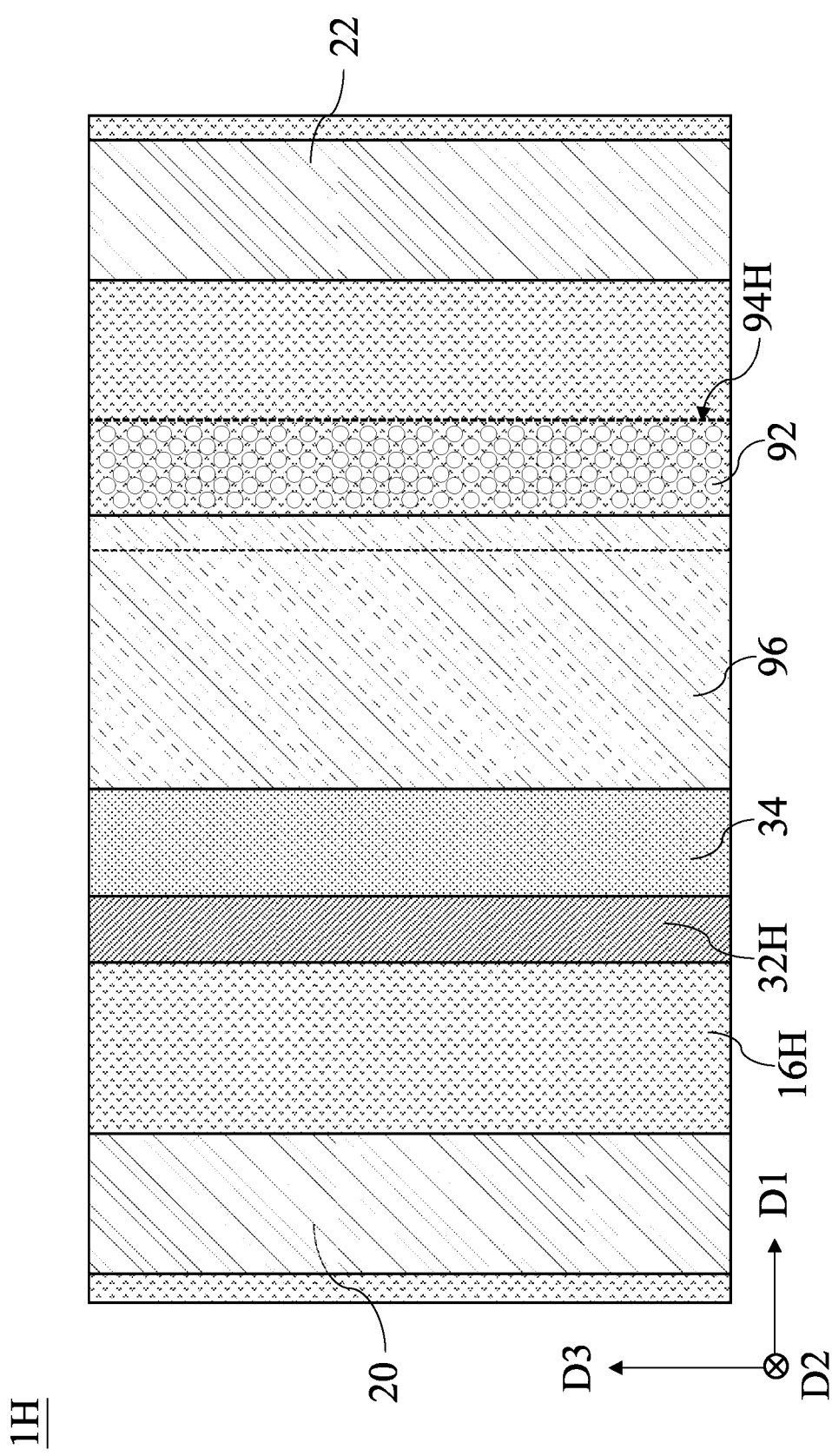
FIG. 10A is a top view of a semiconductor device according to some embodiments of the present disclosure.
Figure 10B:
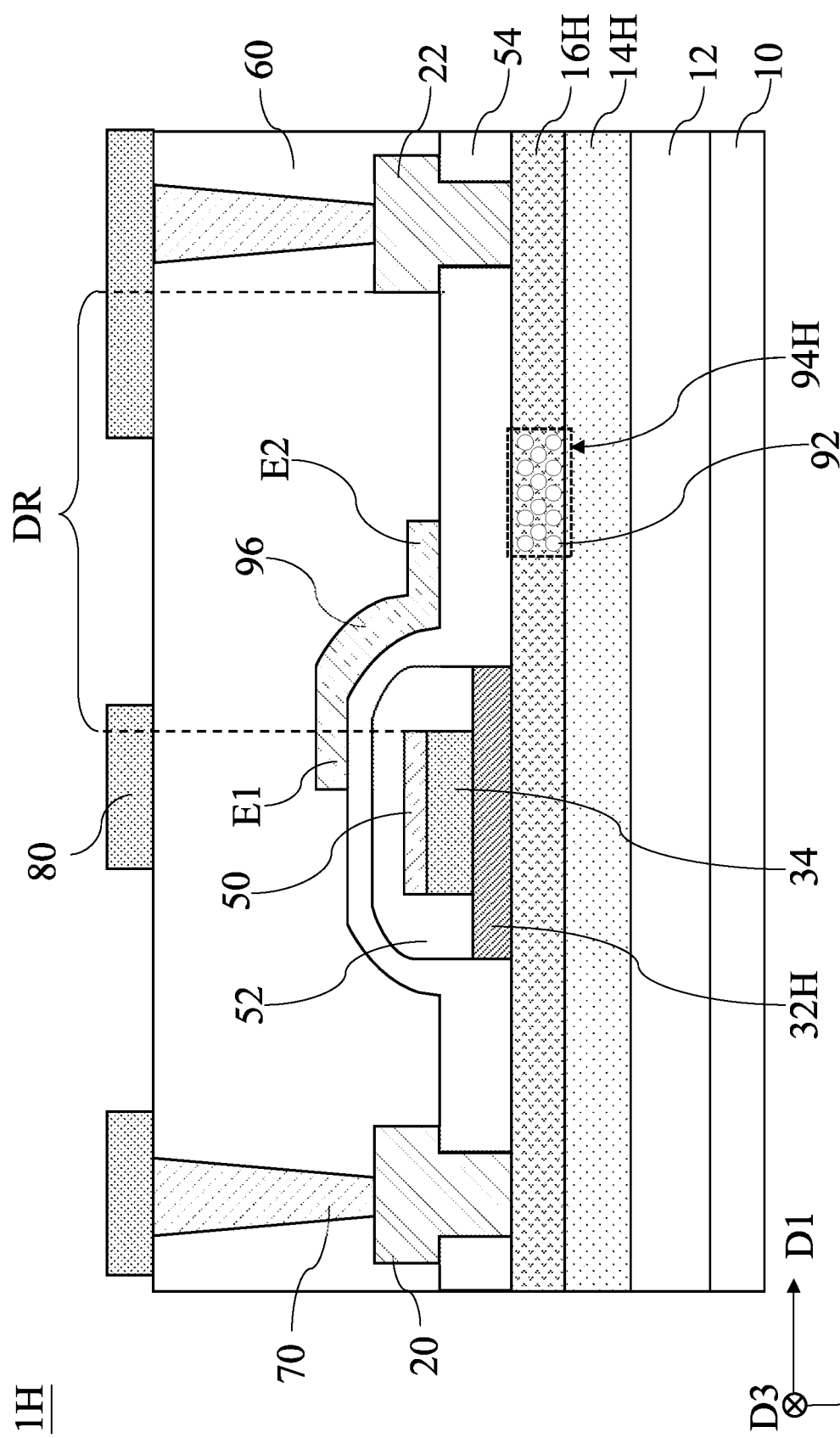
FIG. 10B is a vertical cross-sectional view of the semiconductor device in FIG. 10A.

FIG. 10A is a top view of a semiconductor device 1H according to some embodiments of the present disclosure. FIG. 10B is a vertical cross-sectional view of the semiconductor device 1H in FIG. 10A. The directions D1, D2 and D3 are labeled in the FIGS. 10A and 10B. The directions D1, D2 and D3 are different from each other. In some embodiments, the directions D1, D2 and D3 are perpendicular to each other.

The semiconductor device 1H includes a substrate 10, a buffer layer 12, nitride-based semiconductor layers 14H and 16H, electrodes 20 and 22, a doped nitride-based semiconductor layer 32H, a gate electrode 34, a dielectric layer 50, 52, 54, a passivation layer 60, contact vias 70, a patterned circuit layer 80, a group of negatively-charged ions 92, and a field plate 96. The descriptions for the identical or similar layers as afore mentioned are omitted.

A drift region DR is defined between the gate electrode 32 and the electrode 22. A group of negatively-charged ions 92, which are selected from a highly electronegative group, are implanted/doped into the drift region DR and over the 2DEG region, such that a high resistivity zone 94H is formed/embedded in the nitride-based semiconductor layer 16H (e.g., barrier layer).

The gate electrode 34 and the electrode 22 extend along a direction D3, and the negatively-charged ions 92 are distributed along the direction D3 to form a high resistivity zone 94H. The high resistivity zone 94H can serve as a high resistivity strip 94H in the drift region DR. The doped nitride-based semiconductor layer 32H and the gate electrode 34 are vertically spaced apart/separated from the negatively-charged ions 92/high resistivity zone 94H. The doped nitride-based semiconductor layer 32H is vertically and horizontally separated from the high resistivity zone 94H. The gate electrode 34 is vertically and horizontally separated from the high resistivity zone 94H. The gate electrode 34 is closer to the high resistivity zone 94H than the electrode 22. The negatively-charged ions 92 are spaced apart from an area/a region directly beneath the gate electrode 32 and the electrode 22.

The dielectric layers 50 and 52 can be disposed on/over/above the gate electrode 34 and the nitride-based semiconductor layer 16H. The dielectric layers 50 and 52 covers the gate electrode 34. The nitride-based semiconductor layer 16H is free from coverage of the dielectric layers 50 and 52. The dielectric layer 54 can be disposed on/over/above the nitride-based semiconductor layer 16H and covers the dielectric layers 50, 52 and the high resistivity zone 94H.

The field plate 96 can be disposed on/over/above the dielectric layer 54. The field plate 96 can be disposed on/over/above the gate electrode 34. The field plate 96 can extend in a region between the gate electrode 34 and the high resistivity zone 94H. The field plate 96 extends along the direction D1 to span from the gate electrode 34 toward the high resistivity zone 94H. The field plate 96 forms an interface with the dielectric layer 54. The field plate 96 is conformal with the dielectric layer 54.

The field plate 96 has two opposite end portions E1 and E2. The end portion E1 is directly above the gate electrode 34. The end portion E2 is in a position lower than the end portion E1. The end portion E2 of the field plate 96 vertically overlaps with the high resistivity zone 94H. The high resistivity zone 94H is closer to the electrode 22 than the end portion E2 of the field plate 96. A vertical projection of the field plate 96 on the nitride-based semiconductor layer 16H at least partially overlaps with the high resistivity zone 94H. Therefore, the density of the electric lines near the edge of the field plate 96 can be reduced, so as to alleviate the peak intensity of the electric field near the field plate 96, thereby suppressing the breakdown phenomenon.

The exemplary materials of the field plate 96 can include, for example but are not limited to, conductive materials, such as Ti, Ta, TiN, TaN, or combinations thereof. In some embodiments, other conductive materials such as Al, Cu doped Si, and alloys including these materials may also be used.

In the present disclosure, by designing the doping location of the negatively-charged ions 92 according to the location of the single field plate 96, the field plate 96 and the high resistivity zone 94H can collectively modify the electric field distribution of the semiconductor device 1H.

Hence, the semiconductor device 1H can have a good electric field distribution without using excessive field plates. The reliability of the semiconductor device 1H can be improved.

FIG. 10C is a distribution of the negatively-charged ions in a region of the semiconductor device 1H in the FIG. 10B. The distribution of the negatively-charged ions 92 in the nitride-based semiconductor layer 16H in the FIG. 10C can be identical or similar to that of the negatively-charged ions 92 in the nitride-based semiconductor layer 16D in the FIG. 5C.

Different stages of a method for manufacturing the semiconductor device 1H are shown in FIG. 11A, FIG. 11B, FIG. 11C, FIG. 11D, FIG. 11E, FIG. 11F, FIG. 11G, and FIG. 11H, as described below.

Figure 11A:
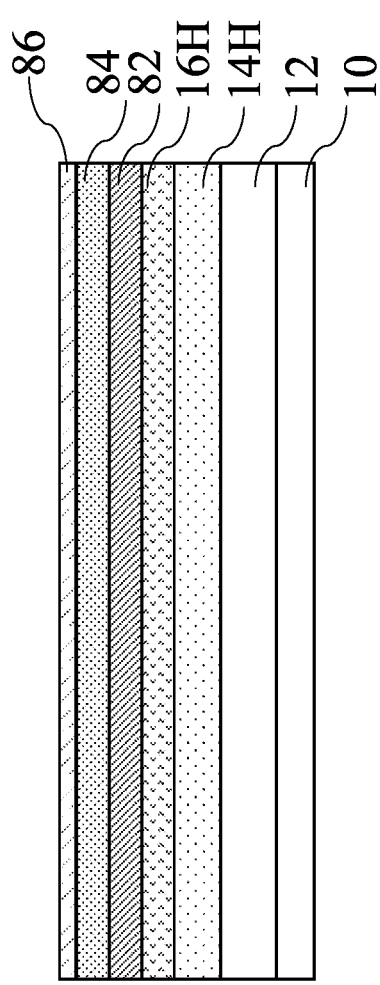
FIG. 11A, FIG. 11B, FIG. 11C, FIG. 11D, FIG. 11E, FIG. 11F, FIG. 11G, and FIG. 11H show different stages of a method for manufacturing a semiconductor device according to some embodiments of the present disclosure.

Referring to FIG. 11A, a buffer layer 12 can be formed on/over/above a substrate 10 by using deposition techniques. A nitride-based semiconductor layer 14H can be formed on/over/above the buffer layer 12 by using deposition techniques. A nitride-based semiconductor layer 16H can be formed on/over/above the nitride-based semiconductor layer 14H by using deposition technique, so that a heterojunction is formed therebetween. A blanket doped nitride-based semiconductor layer 82 can be formed on/over/above the nitride-based semiconductor layer 16H. A blanket gate electrode layer 84 is formed on the blanket doped nitride-based semiconductor layer 82. A blanket dielectric layer 86 can be formed on/over/above the blanket gate electrode layer 84.

Figure 11B:
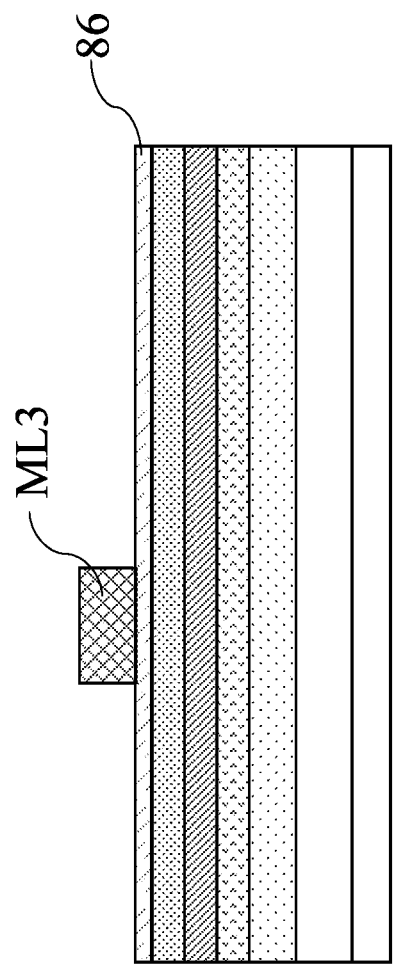

Referring to FIG. 11B, a mask layer ML3 can be formed on the blanket dielectric layer 86. The formation of the mask layer ML3 may include a pattering process. After the pattering process, some portions of the blanket dielectric layer 86 can be exposed.

Figure 11C:
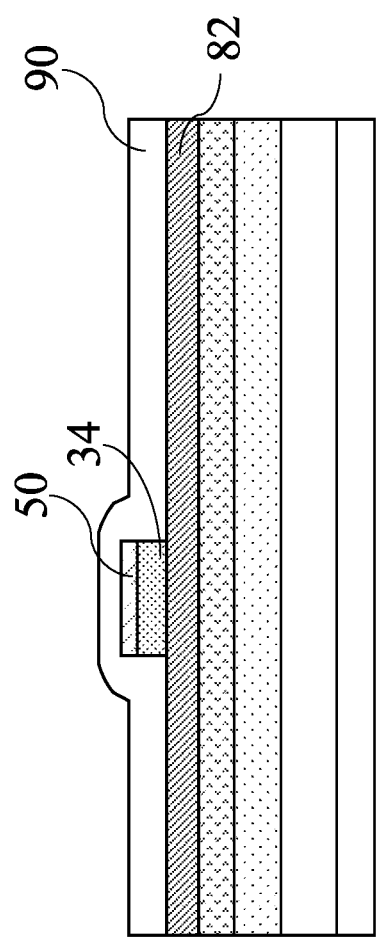

Referring to FIG. 11C, a patterning process is performed on the blanket dielectric layer 90 and the blanket gate electrode layer 84, so as to form the dielectric layer 50 and the gate electrode 34. A blanket dielectric layer 90 can be formed to cover the dielectric layer 50, the gate electrode 34 and the blanket nitride-based semiconductor layer 82.

Figure 11D:
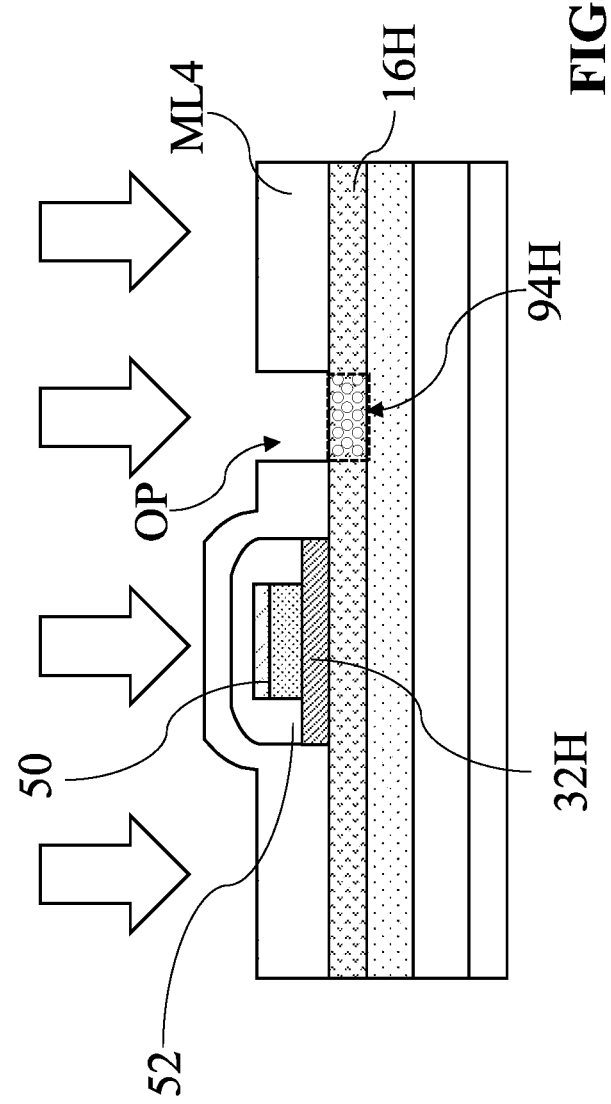

Referring to FIG. 11D, a patterning process is performed on the blanket dielectric layer 90 and the blanket nitride-based semiconductor layer 82, so as to form a dielectric layer 52 and a doped nitride-based semiconductor layer 32H. The dielectric layer 52 covers the gate electrode 34 and the doped nitride-based semiconductor layer 32H.

A mask layer ML4 with at least one opening OP is formed on/over/above the nitride-based semiconductor layer 16H and the dielectric layer 52. At least one portion of the nitride-based semiconductor layer 16H is exposed from the opening OP. The opening OP of the mask layer ML4 is strip-shaped. Then, an ion implantation process is performed such that the exposed portion of the nitride-based semiconductor layer 16H is doped with a dopant selected from a highly electronegative group, so as to form a high resistivity zone 94H in the nitride-based semiconductor layer 16H.

Figure 11E:
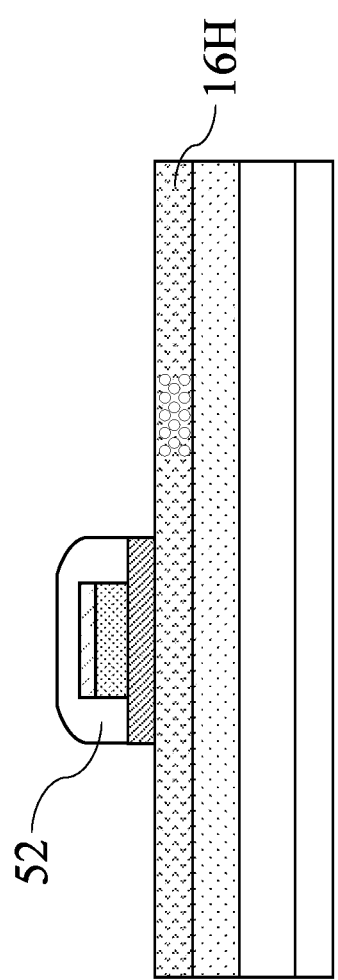

Referring to FIG. 11E, the mask ML4 is removed from the nitride-based semiconductor layer 16H and the dielectric layer 52.

Figure 11F:
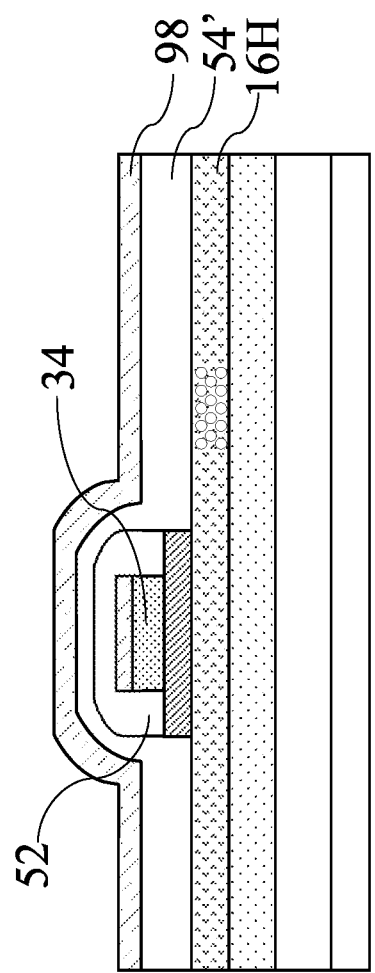

Referring to FIG. 11F, a blanket dielectric layer 54' is formed to cover the dielectric layer 52 and the nitride-based semiconductor layer 16H. A blanket field plate layer 98 (i.e., blanket conductive layer) is formed to cover the dielectric layer 54' and over the gate electrode 34.

Figure 11G:
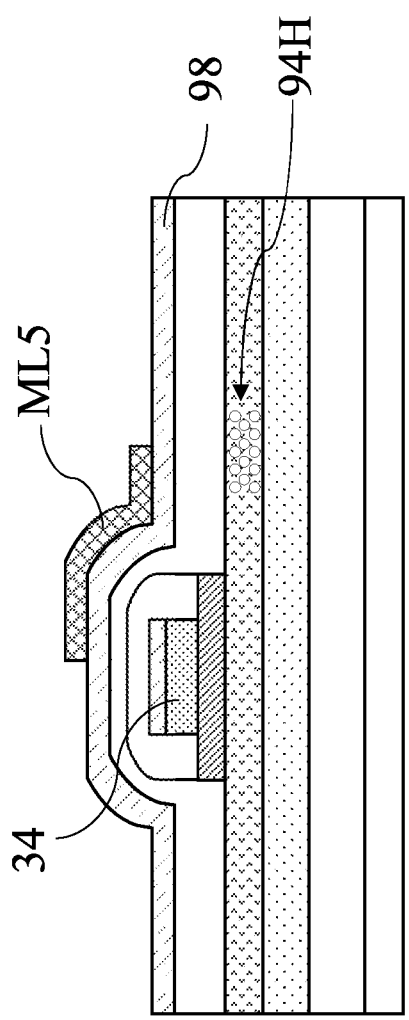

Referring to FIG. 11G, a mask layer ML5 is formed on the blanket field plate layer 98. The mask layer ML5 vertically overlaps with the high resistivity zone 94H. The right end portion of the mask layer ML5 is directly over the high resistivity zone 94H. The left end portion of the mask layer ML5 is directly over the gate electrode 34.

Figure 11H:
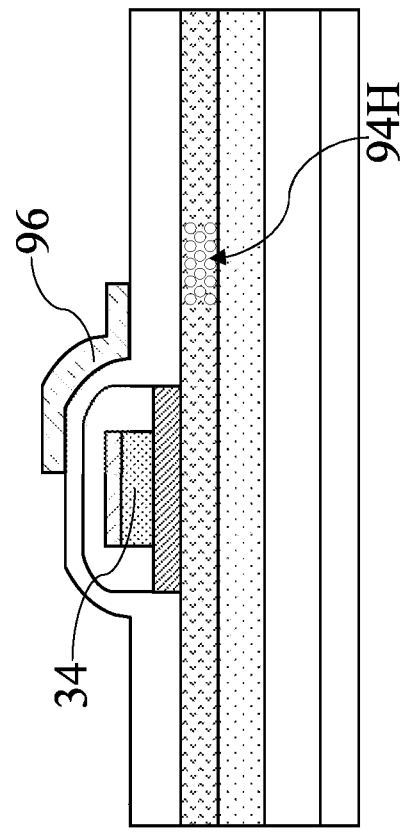

Referring to FIG. 11H, a patterning process is performed on the blanket field plate layer 98 using the mask layer ML5, so as to form a field plate 96. The field plate 96 is formed to be over the gate electrode 34 and extends in a region between the gate electrode 34 and the high resistivity zone 94H. A left end of the field plate 96 vertically overlaps with the gate electrode 34. A right end of the field plate 96 vertically overlaps with the high resistivity zone 94H. Thereafter, the electrodes 20 and 22, contact vias 70, a passivation layer 60, and a patterned circuit layer 80 can be formed, obtaining the configuration of the semiconductor device 1H as shown in FIG. 10B.

Figure 12:
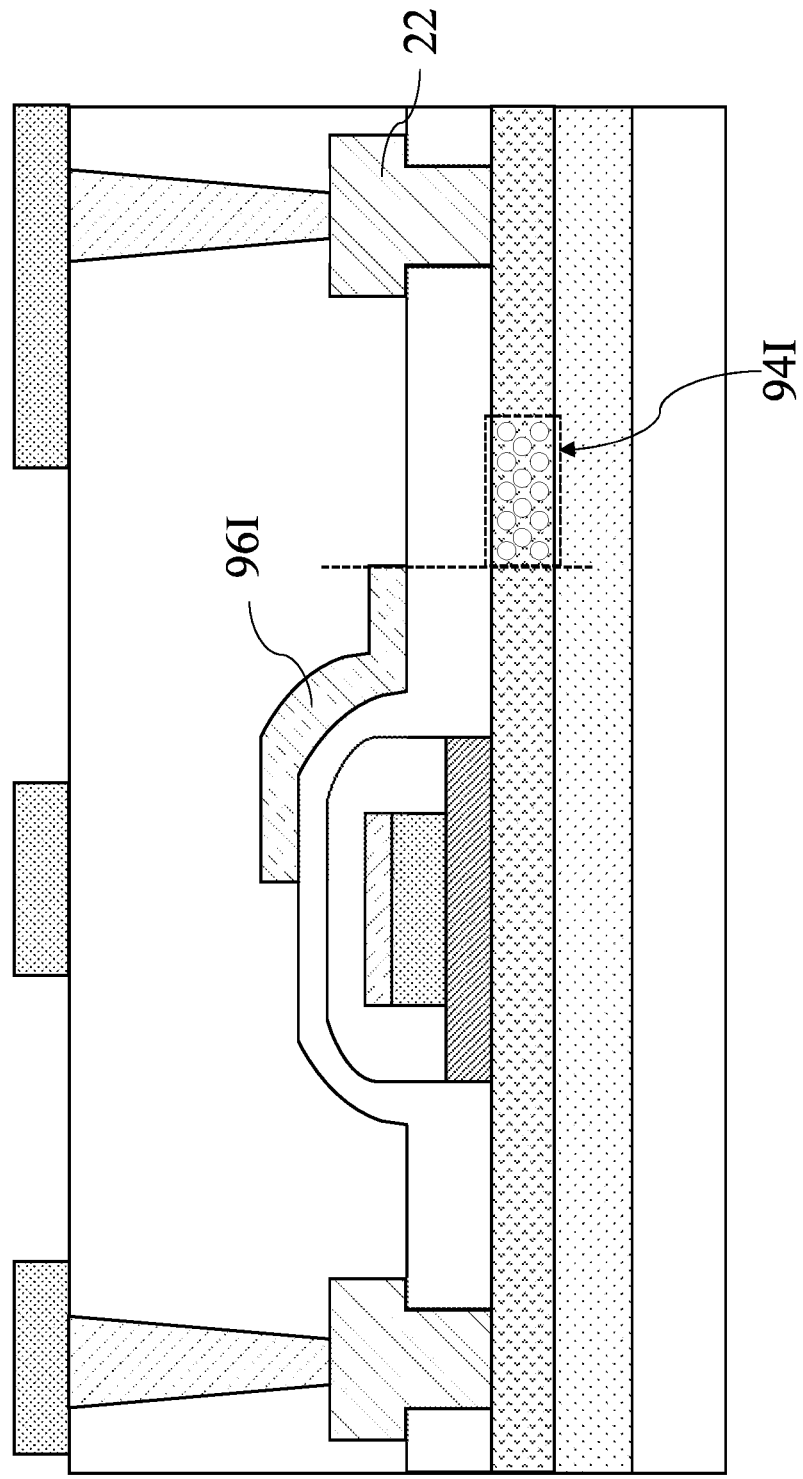
FIG. 12 is a vertical cross-sectional view of a semiconductor device according to some embodiments of the present disclosure.

FIG. 12 is a vertical cross-sectional view of a semiconductor device 1I according to some embodiments of the present disclosure. The semiconductor device 1I is similar to the semiconductor device 1H as described and illustrated with reference to FIG. 10B, except the high resistivity zone 94H is replaced by a high resistivity zone 94I. The high resistivity zone 94I is free from coverage of the field plate 96I. Borders of the high resistivity zone 94I and the field plate 96I exactly vertically coincide with each other.

Figure 13:
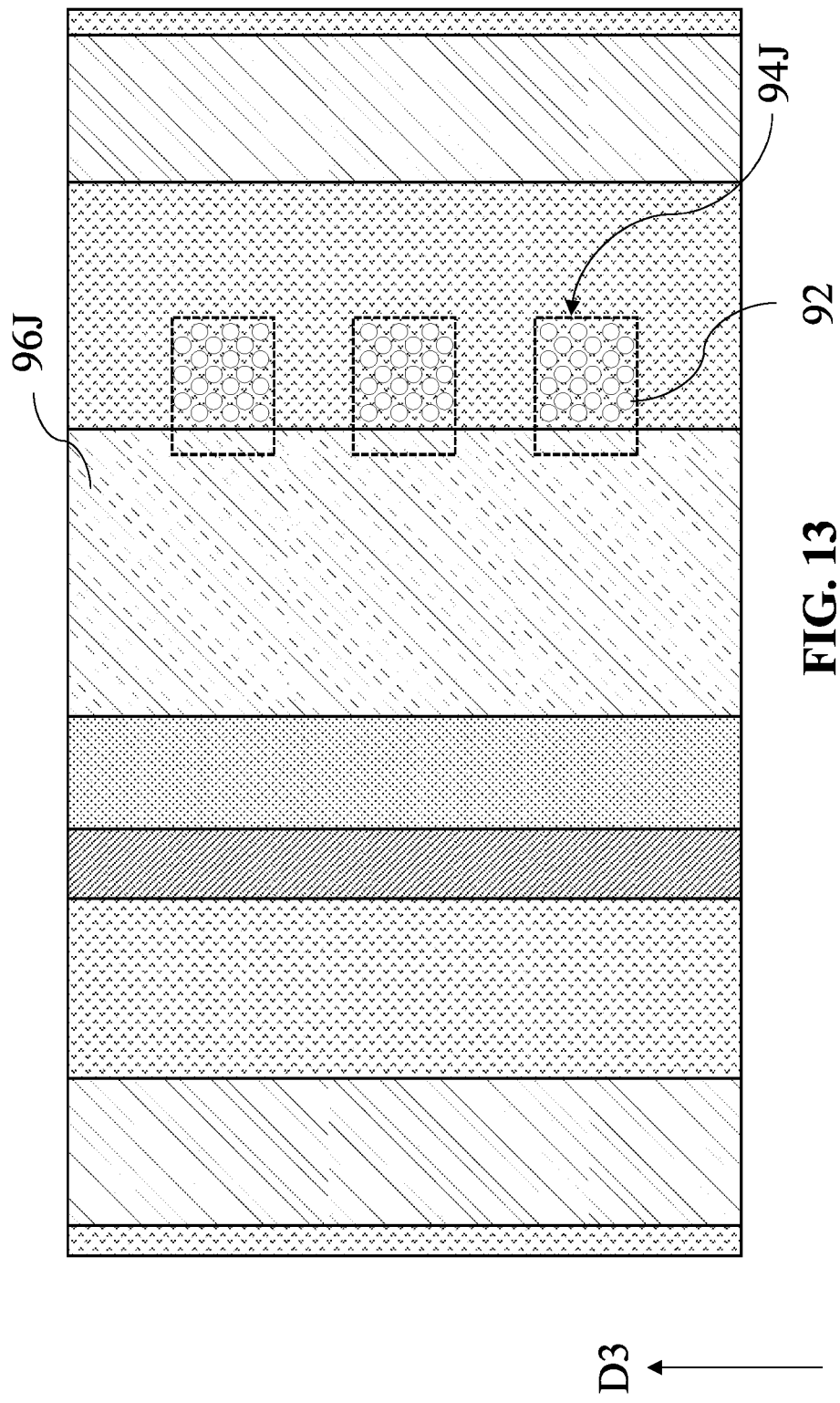
FIG. 13 is a top view of a semiconductor device according to some embodiments of the present disclosure.

FIG. 13 is a top view of a semiconductor device 1J according to some embodiments of the present disclosure. The semiconductor device 1J is similar to the semiconductor device 1H as described and illustrated with reference to FIG. 10A, except the high resistivity zone 94H is replaced by a plurality of separated high resistivity zones 94J.

In the present embodiment, the negatively-charged ions 92 are distributed along the direction D3, which is the same as the extending direction of the field plate 96J. In response to the negatively-charged ions 92, the high resistivity zones 94J are formed in the drift region. The high resistivity zones 94G are arranged along the direction D3. Each of the high resistivity zones 94D is in a shape of rectangular from the top view of the semiconductor device 1J.

Figure 14:
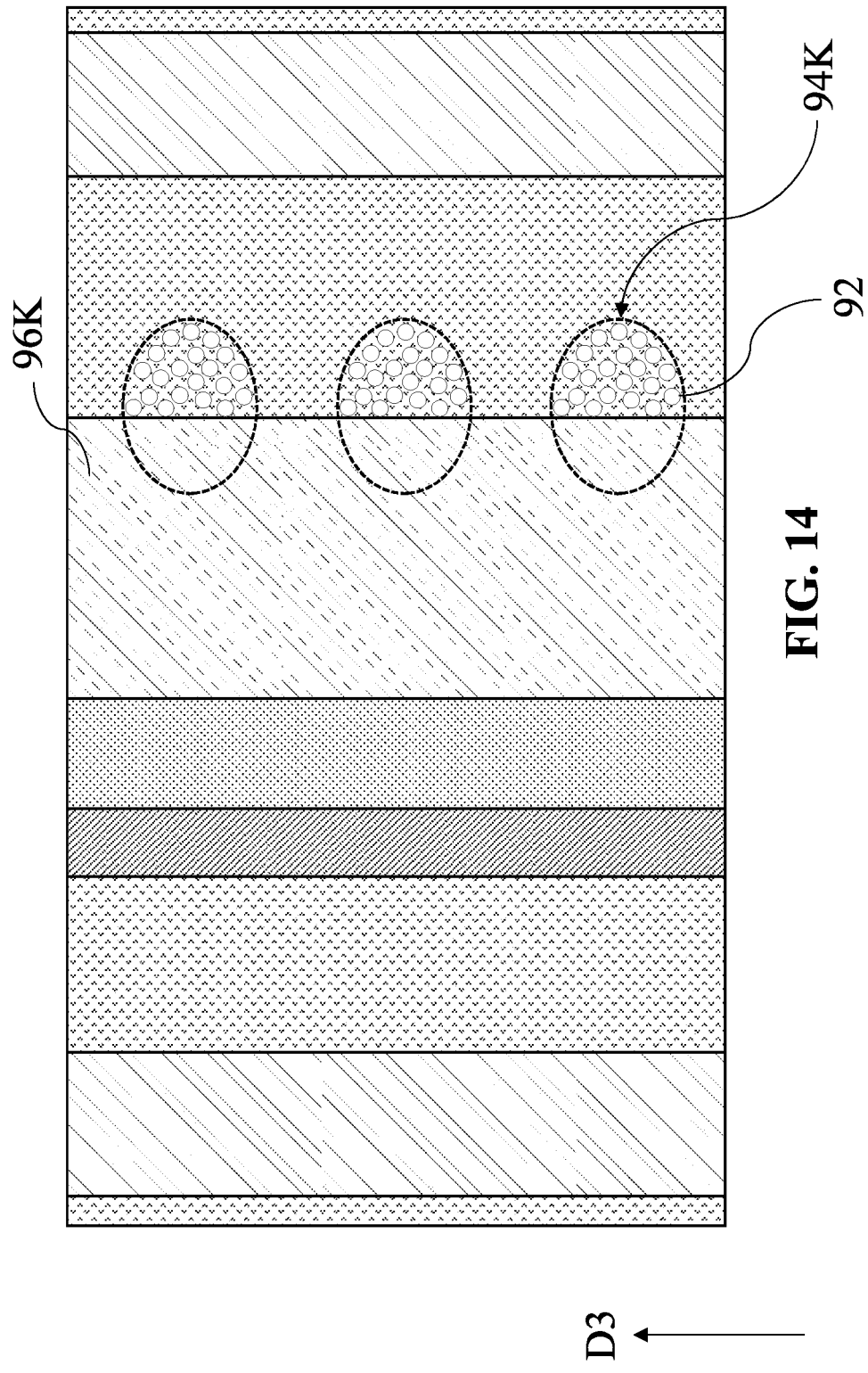
FIG. 14 is a top view of a semiconductor device according to some embodiments of the present disclosure.

FIG. 14 is a top view of a semiconductor device 1K according to some embodiments of the present disclosure. The semiconductor device 1K is similar to the semiconductor device 1H as described and illustrated with reference to FIG. 10A, except the high resistivity zone 94H is replaced by a plurality of separated high resistivity zones 94K.

In the present embodiment, the negatively-charged ions 92 are distributed along the direction D3, which is the same as the extending direction of the field plate 96K. In response to the negatively-charged ions 92, the high resistivity zones 94K are formed in the drift region. The high resistivity zones 94J are arranged along the direction D3. Each of the high resistivity zones 94K is in a shape of ellipse from the top view of the semiconductor device 1K.

Figure 15:
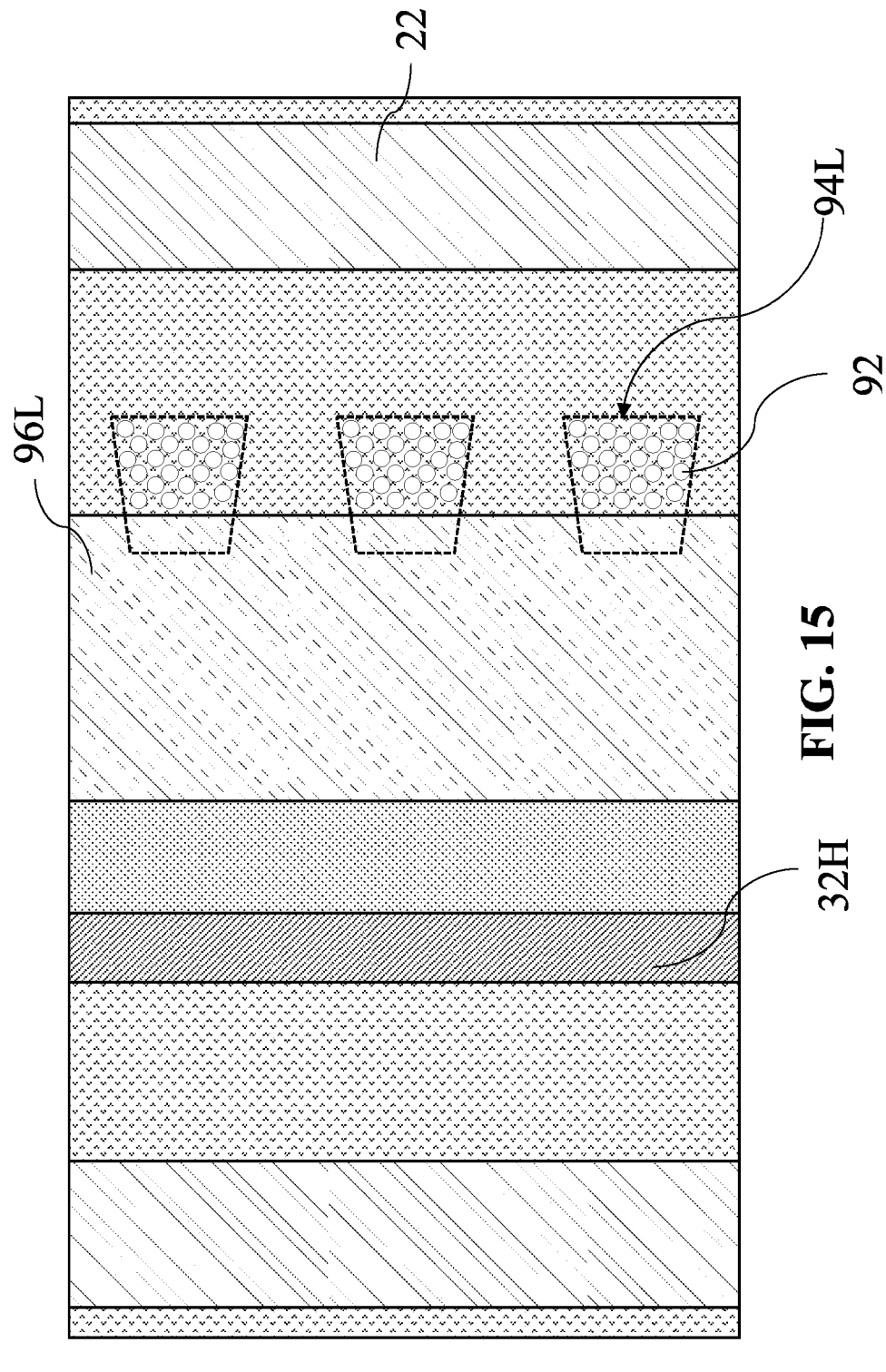
FIG. 15 is a top view of a semiconductor device according to some embodiments of the present disclosure.

FIG. 15 is a top view of a semiconductor device 1L according to some embodiments of the present disclosure. The semiconductor device 1F is similar to the semiconductor device 1H as described and illustrated with reference to FIG. 10A, except the high resistivity zone 94H is replaced by a plurality of separated high resistivity zones 94L.

In the present embodiment, the negatively-charged ions 92 are distributed along the direction D3, which is the same as the extending direction of the field plate 96L. In response to the negatively-charged ions 92, the high resistivity zones 94L are formed in the drift region. The high resistivity zones 94L are arranged along the direction D3. Each of the high resistivity zones 94L has a short side and a long side between the the doped nitride-based semiconductor layer 32H and the electrode 22. Specifically, each of the high resistivity zones 94L is in a shape of trapezoid from the top view of the semiconductor device 1L.

With respect to the semiconductor devices 1J, 1K and 1L, the high resistivity zones 94J/94K/94L are formed to be separated from each other, and the overall resistance thereof can be reduced.

During the manufacturing process of the semiconductor devices 1J, 1K and 1L, the mask layer applied in the ion implantation process has a plurality of the separated openings OP to expose a plurality of portions of the nitride-based semiconductor layer (e.g., barrier layer) thereunder. The shape of the high resistivity zone in the top view of the corresponded semiconductor device can be determined by the shape of the opening OP.

Figure 16:
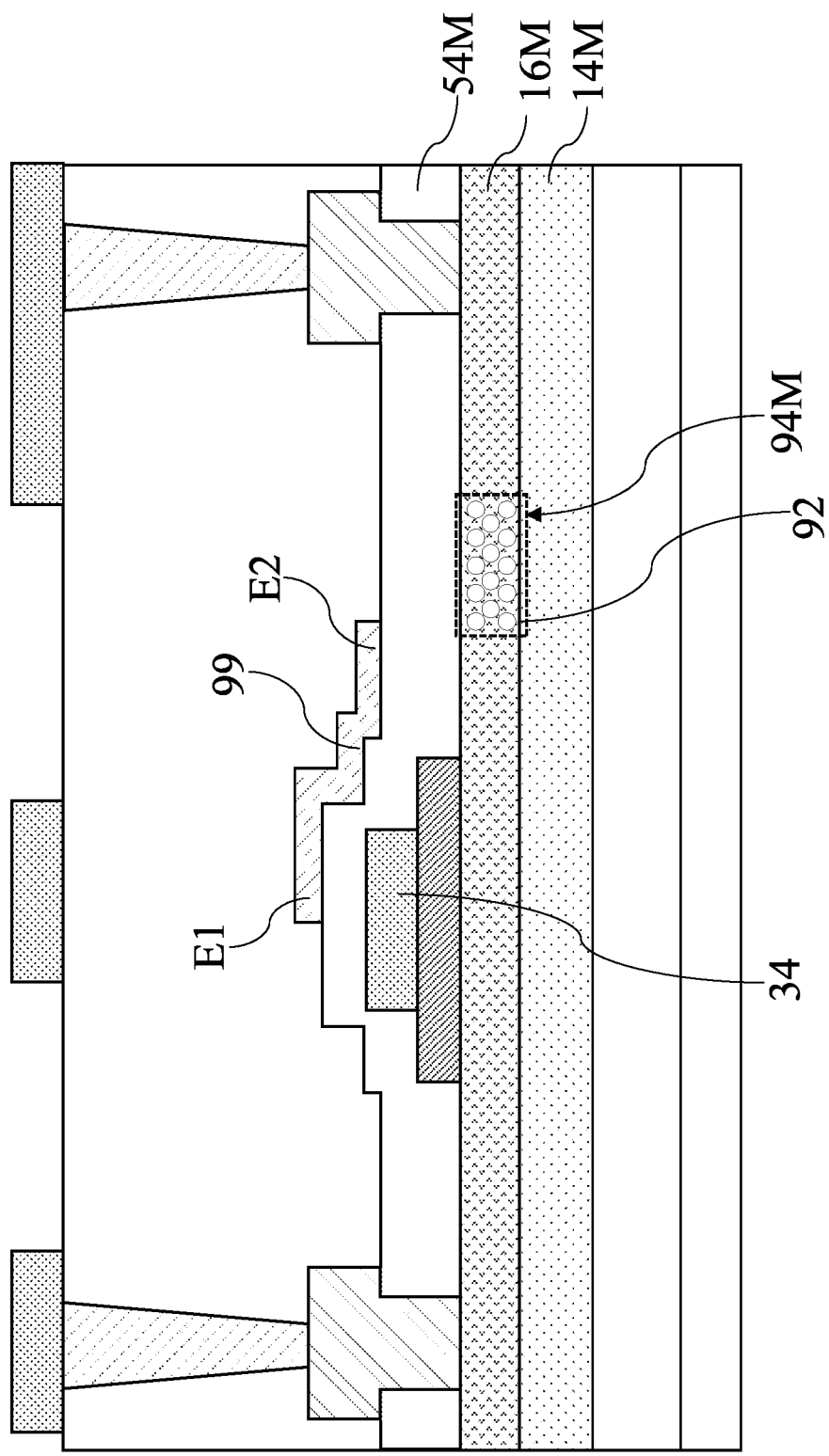
FIG. 16 is a vertical cross-sectional view of a semiconductor device according to some embodiments of the present disclosure.

FIG. 16 is a vertical cross-sectional view of a semiconductor device 1M according to some embodiments of the present disclosure. The semiconductor device 1M is similar to the semiconductor device 1H as described and illustrated with reference to FIG. 10A, except the dielectric layers 50 and 52 are omitted.

Since those dielectric layers are omitted, the dielectric layer 54M directly covers the gate electrode. The dielectric layer 54M can form an interface with the gate electrode 34. The negatively-charged ions 92 are embedded into the nitride-based semiconductor layer 16M to form a high resistivity zone 94M. The high resistivity zone 94M is over the nitride-based semiconductor layer 14M.

A field plate 99 is disposed on the dielectric layer 54M. The field plate 99 is conformal with the dielectric layer 54M. The field plate 99 has a stage-shaped profile. The left end portion E1 of the field plate 99 is directly over the gate electrode 34. The right end portion of the field plate 99 is directly over the high resistivity zone 94M. Since the dielectric layers 50 and 52 are omitted, the thickness of the semiconductor device 1H can be reduced.

Figure 17A:
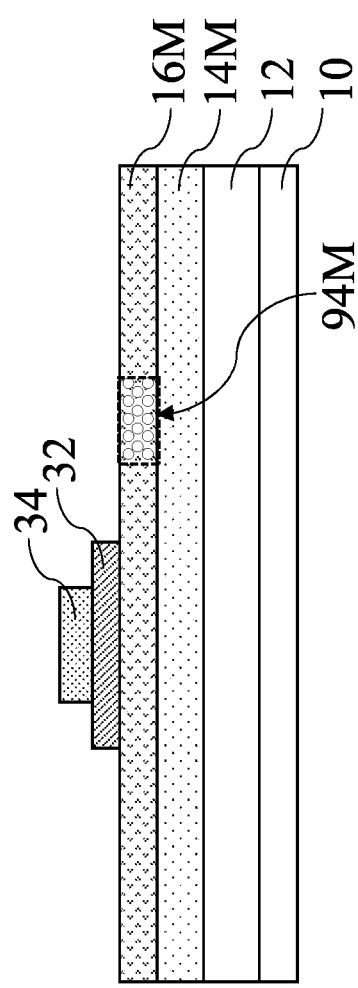
FIG. 17A, FIG. 17B, FIG. 17C, and FIG. 17D show different stages of a method for manufacturing a semiconductor device according to some embodiments of the present disclosure.

Referring to FIG. 17A, a buffer layer 12 and nitride-based semiconductor layers 14M and 16M are formed over a substrate 10. A high resistivity zone 94M is formed in the nitride-based semiconductor layer 16M. A doped nitride-based semiconductor layer 32 and a gate electrode 34 are formed over the nitride-based semiconductor layer 16M.

Figure 17B:
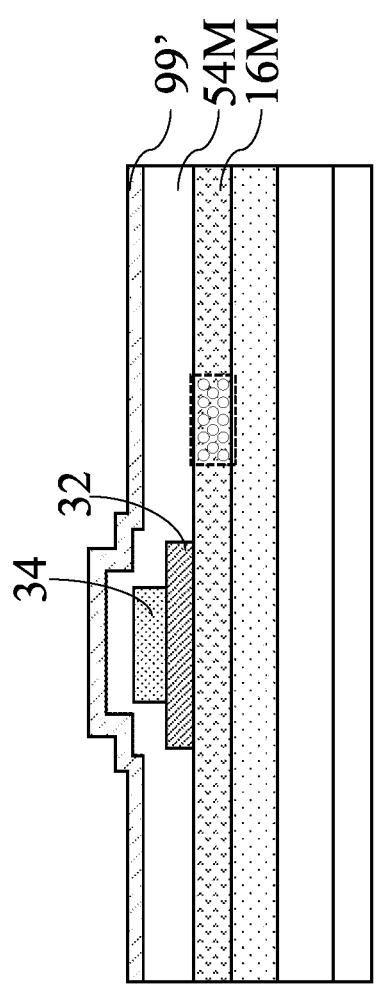

Referring to FIG. 17B, a dielectric layer 54M is formed over the nitride-based semiconductor layer 16M to cover the doped nitride-based semiconductor layer 32 and the gate electrode 34. A blanket field plate 99' is formed over the dielectric layer 54M.

Figure 17C:
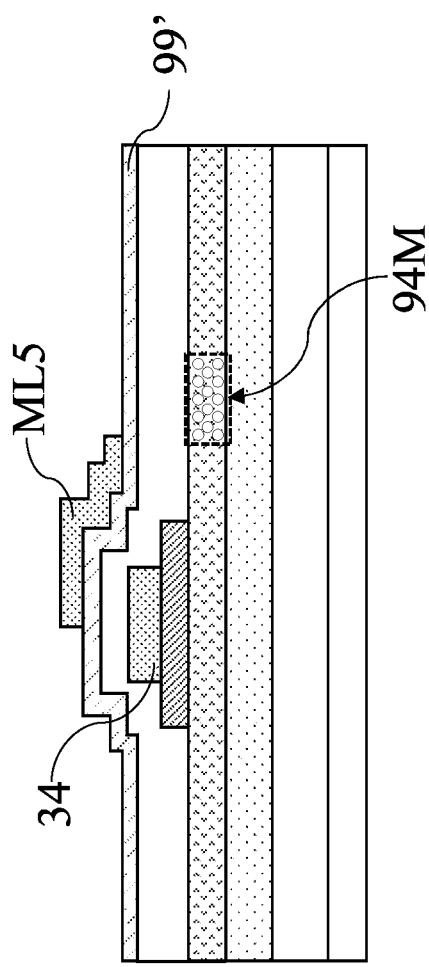

Referring to FIG. 17C, a mask layer ML5 is formed over the blanket field plate 99'. The left end portion of the mask layer ML5 is directly over the gate electrode 34. The right end portion of the mask layer ML5 is directly over the high resistivity zone 94M.

Figure 17D:
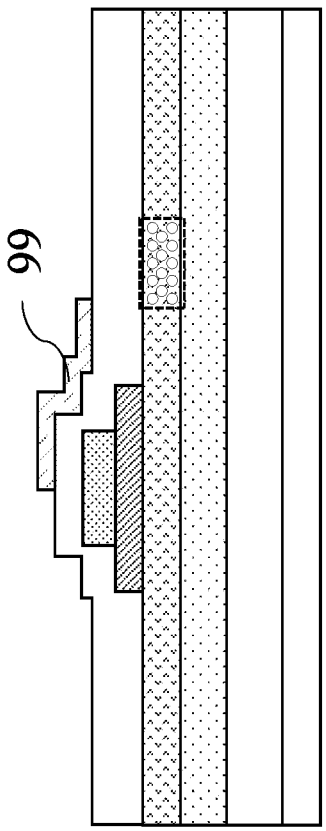

Referring to FIG. 17D, a patterning process is performed on the blanket field plate 99' such that a field plate 99 is formed. The patterning process is performed by using the mask layer ML5. After the patterning process, the mask layer ML5 can be removed from the field plate 99.

Based on the above description, in embodiments of the present disclosure, the doping location of the negatively-charged ions is determined in the barrier layer according to the location of the gate electrode or single field plate; and therefore, the electrical properties of the semiconductor device can be can be further promoted without using any field plate or with only a single field plate. As such, the semiconductor device can have good electrical properties and reliability.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
a first nitride-based semiconductor layer;
a second nitride-based semiconductor layer disposed on the first nitride-based semiconductor layer and having a bandgap greater than a bandgap of the first nitride-based semiconductor layer, so as to form a heterojunction therebetween with a two-dimensional electron gas (2DEG) region;
a gate electrode disposed above the second nitride-based semiconductor layer; and
a doped nitride-based semiconductor layer disposed between the second nitride-based semiconductor layer and the gate electrode;
a source electrode and a drain electrode disposed above the second nitride-based semiconductor layer, wherein the gate electrode is located between the source and drain electrodes to define a drift region between the gate and drain electrodes; and
a group of negatively-charged ions implanted into the drift region and over the 2DEG region and spaced apart from the gate and drain electrodes and spaced apart from areas directly beneath the gate electrode and the doped nitride-based semiconductor layer and the drain electrode, wherein the gate electrode and the doped nitride-based semiconductor layer are closer to the negatively-charged ions than the drain electrode, such that the negatively-charged ions deplete at least one portion of the 2DEG region which is near the gate electrode;
wherein a distributed density of the group of negatively-charged ions in the second nitride-based semiconductor layer is non-uniform and increases and then decreases along a first direction pointing from a top surface to a bottom surface of the second nitride-based semiconductor layer.

2. The semiconductor device of claim 1, wherein the gate electrode and the source and drain electrodes extend along a second direction, and the group of negatively-charged ions are distributed along the second direction to form a high resistivity strip in the drift region.

3. The semiconductor device of claim 1, wherein the gate electrode and the source and drain electrodes extend along a second direction, and the group of negatively-charged ions are distributed along the second direction to form a plurality of high resistivity zones in the drift region.

4. The semiconductor device of claim 1, wherein the group of negatively-charged ions are distributed from the top surface to the bottom surface of the second nitride-based semiconductor layer.

5. The semiconductor device of claim 1, further comprising:
a dielectric layer covering the gate electrode and the second nitride-based semiconductor layer, wherein the group of negatively-charged ions are adjacent with an interface formed between the second nitride-based semiconductor layer and the dielectric layer, and the source and drain electrodes penetrate the dielectric layer to make contact with the second nitride-based semiconductor layer.

6. The semiconductor device of claim 1, wherein the semiconductor device does not include a field plate.

7. The semiconductor device of claim 1, wherein the group of negatively-charged ions are dopants selected from a highly electronegative group.

8. The semiconductor device of claim 1, wherein the group of negatively-charged ions include fluorine.

* * * * *